United States Patent
Haratsch et al.

(10) Patent No.: US 8,699,557 B2
(45) Date of Patent: *Apr. 15, 2014

(54) PIPELINED DECISION-FEEDBACK UNIT IN A REDUCED-STATE VITERBI DETECTOR WITH LOCAL FEEDBACK

(75) Inventors: Erich F. Haratsch, Bethlehem, PA (US); Kameran Azadet, Morganville, NJ (US)

(73) Assignee: Agere Systems LLC, Allentown, PA (US)

(*) Notice: Subject to any disclaimer, the term of this patent is extended or adjusted under 35 U.S.C. 154(b) by 51 days.

This patent is subject to a terminal disclaimer.

(21) Appl. No.: 13/082,881

(22) Filed: Apr. 8, 2011

(65) Prior Publication Data

US 2011/0243281 A1 Oct. 6, 2011

Related U.S. Application Data

(63) Continuation of application No. 12/640,590, filed on Dec. 17, 2009, now abandoned, which is a continuation of application No. 10/962,188, filed on Oct. 8, 2004, now Pat. No. 7,656,959, which is a continuation-in-part of application No. 09/834,668, filed on Apr. 13, 2001, now Pat. No. 7,000,175.

(51) Int. Cl.
   *H04L 27/06* (2006.01)

(52) U.S. Cl.
   USPC ............ 375/233; 375/290; 375/324; 375/340

(58) Field of Classification Search
   USPC .................. 375/233, 290, 324, 340
   See application file for complete search history.

(56) References Cited

U.S. PATENT DOCUMENTS

| | | |
|---|---|---|
| 5,136,593 A | 8/1992 | Moon et al. |
| 5,220,570 A | 6/1993 | Lou et al. |
| 5,291,523 A | 3/1994 | Bergmans et al. |
| 5,513,216 A * | 4/1996 | Gadot et al. .......... 375/233 |
| 5,805,479 A | 9/1998 | Tang |
| 5,844,946 A | 12/1998 | Nagayasu |
| 5,870,433 A | 2/1999 | Huber et al. |
| 5,881,106 A | 3/1999 | Cartier |
| 5,910,968 A | 6/1999 | Chouly et al. |
| 5,970,104 A | 10/1999 | Zhong et al. |
| 6,035,006 A | 3/2000 | Matui |
| 6,088,404 A | 7/2000 | Jekal |
| 6,201,831 B1 | 3/2001 | Agazzi et al. |

(Continued)

OTHER PUBLICATIONS

Haratsch et al. "Pipelined Reduced-State Sequenced Estimation", Nov. to Dec. 2000, IEEE.*

(Continued)

Primary Examiner — Sophia Vlahos
(74) Attorney, Agent, or Firm — Ryan, Mason & Lewis, LLP

(57) ABSTRACT

A pipelined decision feedback unit (DFU) is disclosed for use in reduced-state Viterbi detectors with local feedback. The disclosed pipelined decision feedback unit improves the maximum data rate that may be achieved by the reduced state Viterbi detector by the pipelined computation of partial intersymbol interference-based estimates. A pipelined decision feedback unit is thus disclosed that computes a plurality of partial intersymbol interference based estimates, wherein at least one partial intersymbol interference-based estimate is based on a selected partial intersymbol interference-based estimate; and selects the selected partial intersymbol interference-based estimate from among partial intersymbol interference-based estimates for path extensions into a state.

21 Claims, 21 Drawing Sheets

(56) References Cited

U.S. PATENT DOCUMENTS

| | | | |
|---|---|---|---|
| 6,252,904 | B1 | 6/2001 | Agazzi et al. |
| 6,291,523 | B1 | 9/2001 | Fujimoto et al. |
| 6,690,739 | B1 | 2/2004 | Mui |
| 6,690,754 | B1 * | 2/2004 | Haratsch et al. ............... 375/346 |
| 6,744,814 | B1 | 6/2004 | Blanksby et al. |
| 6,778,602 | B2 | 8/2004 | Agazzi et al. |
| 6,999,521 | B1 * | 2/2006 | Azadet et al. ................. 375/262 |
| 7,000,175 | B2 | 2/2006 | Azadet et al. |
| 7,177,353 | B2 | 2/2007 | Abnous et al. |
| 2002/0083396 | A1 | 6/2002 | Azadet et al. |
| 2002/0122480 | A1 | 9/2002 | Abnous et al. |

OTHER PUBLICATIONS

U.S. Appl. No. 09/471,920, filed Dec. 23, 1999, Azadet et al.
U.S. Appl. No. 09/804,082, filed Mar. 12, 2001, Abnous.
U.S. Appl. No. 09/834,668, filed Apr. 13, 2001, Azadet et al.
Black et al., "A 140-Mb/s, 32-State, Radix-4 Viterbi Decoder," IEEE Journal of Solid-State Circuits, vol. 27, No. 12, (Dec. 1992).
Cypher et al., "Generalized Trace-Back Techniques for Survivor Memory Management in the Viterbi Algorithm," Journal of VLSI Signal Processing, 5, pp. 85-94 (1993).
Haratsch, E.F., "High-Speed VLSI Implementation of Reduced Complexity Sequence Estimation Algorithms with Applications to Gigabit Ethernet 1000Base-T," 1999 Interntional Symposium on VLSI Technology, and Applications, Jun. 8-10, 1999, pp. 171-174.
Haratsch, E.F., "Viterbi Dectector Architectures for Magnetic Recording," 2003 International Symposium on VLSI Technology, Systems, and Applicatons, Oct. 6-8, 2003, pp. 239-242.
Haratsch, E.F., "Viterbi Detector Architectures for Magnetic Recording," IEEE, pp. 239-242 (2003).
Azadet, K., "Gigabit Ethernet Over Unshielded Twisted Pair Cables," 1999 International Symposium on VLSI Technology, and Applications, Jun. 8-10, 1999, pp. 167-170.
Bednarz et al., "Design Performance, and Extensions of the RAM-DFE Architecture," IEEE Transactions on Magnetics, vol. 31, No. 2, pp. 1196-1201 (Mar. 1995).
Black et al., "A 140-Mb/s, 32-State, Radix-4 Viterbi Decoder," IEEE Journal of Solid-State Circuits, vol. 27, No. 12 (Dec. 1992).
Chevillat et al., "Decoding of Trellis-Encoded Signals in the Presence of Intersymbol Interference and Noise," IEEE Transactions on Communications, vol. 37, No. 7 (Jul. 1989).
Cypher et al., "Generalized Trace-Back Techniques for Survivor Memory Management in the Viterbi Algorithm, " Journal of VLSI Signal Processing, 5, pp. 85-94 (1993).
Fettweis et al., "High-Speed Parallel Viterbi Decoding: Algorithm and VLSI-Architecture," IEEE Communications Magazine (May 1991).
Haratsch, E.F., "High-Speed VLSI Implementation of Reduced Complexity Sequence Estimation Algorithms with Applications to Gigabit Ethernet 1000Base-T," 1999 International Symposium on VLSI Technology, and Applications, Jun. 8-10, 1999, pp. 171-174.
Haratsch, E.F., "Viterbi Dectector Architectures for Magnetic Recording," 2003 International Symposium on VLSI Technology, Systems, and Applications, Oct. 6-8, 2003, pp. 239-242. Parhi, K.K., "Pipelining in Algorithms with Quantizer Loops," IEEE Transactions on Circuits and Systems, vol. 38, No. 7, pp. 745-754 (Jul. 1991).
Rizos et al., "Reduced-Complexity Sequence Detection Approaches for PR-Shaped, Coded Linear Modulations," IEEE Global Telecommunications Conference, vol. 1, pp. 342-346 (Nov. 1997).
Haratsch et al., "A Pipelined 14-Tap Parallel Decision-Feedback Decoder for 1000Base-T Gigabit Ethernet," VLSI Technology, System, and Applications, Proceedings of Technical Papers, pp. 117-120 (2001).
Haratsch et al., "Pipelined Reduced-State Sequence Estimation," Globecom'00 IEEE Global Telecommunications Conference, vol. 2 of 4, pp. 1046-1050 (2000).
Haratsch E.F., "Viterbi Detector Architectures for Magnetic Recording," IEEE, pp. 239-242 (2003).
Parhi, K.K., "Pipelining in Algorithms with Quantizer Loops," IEEE Transactions on Circuits and Systems, vol. 38, No. 7, pp. 745-754 (Jul. 1991).

* cited by examiner

FIG. 20

1-D SUBSETS — 2010
(ONE WIRE PAIR):

2 ■ B
1 ● A
0 ■ B
−1 ● A
−2 ■ B $\Delta^2 = 4$

4-D SUBSETS — 2020
(4 WIRE PAIRS):

S(6)

PAIR 1
PAIR 2
PAIR 3
PAIR 4

A-TYPE ∪ B-TYPE

S(0) : AAAA ∪ BBBB
S(1) : AAAB ∪ BBBA
S(2) : AABB ∪ BBAA
S(3) : AABA ∪ BBAB
S(4) : ABBA ∪ BAAB
S(5) : ABBB ∪ BAAA
S(6) : ABAB ∪ BABA
S(7) : ABAA ∪ BABB $\Delta^2 = 2$

FIG. 21

$r_n$ → ISI ESTIMATE PRECOMPUTATION 2200 → ISI ESTIMATE SELECTION 2300 → 1-D ERROR METRIC PRECOMPUTATION 2400 → 1-D ERROR METRIC SELECTION 2600 → BRANCH METRIC COMPUTATION → ACSU 2130 → SMU 2700 → BITS

PIPELINED DFU 2110
PIPELINED BMU 2120

ACS DECISIONS
SURVIVOR SYMBOLS

2100

US 8,699,557 B2

PIPELINED DECISION-FEEDBACK UNIT IN A REDUCED-STATE VITERBI DETECTOR WITH LOCAL FEEDBACK

CROSS-REFERENCE TO RELATED APPLICATIONS

This application is a continuation of U.S. patent application Ser. No. 12/640,590, filed Dec. 17, 2009, which is a continuation of U.S. patent application Ser. No. 10/962,188, filed Oct. 8, 2004, which is a continuation in part application of U.S. patent application Ser. No. 09/834,668, filed Apr. 13, 2001, and is related to U.S. patent application Ser. No. 10/853,087, entitled "Method and Apparatus for Multiple Step Viterbi Detection with Local Feedback," U.S. patent application Ser. No. 10/853,090, entitled "Method and Apparatus for Reduced-State Viterbi Detection in a Read Channel of a Magnetic Recording System," U.S. patent application Ser. No. 10/853,089, entitled "Method and Apparatus for Precomputation and Pipelined Selection of Branch Metrics in a Reduced-State Viterbi Detector," and U.S. patent application Ser. No. 10/853,088, entitled "Method and Apparatus for Precomputation and Pipelined Selection of Intersymbol Interference Estimates in a Reduced-State Viterbi Detector," each incorporated by reference herein.

FIELD OF THE INVENTION

The present invention relates generally to equalization, detection and decoding techniques and, more particularly, to the implementation of sequence estimation techniques with reduced complexity.

BACKGROUND OF THE INVENTION

A magnetic recording read channel converts an analog read channel into an estimate of the user data recorded on a magnetic medium. Read heads and magnetic media introduce noise and other distortions into the read signal. As the information densities in magnetic recording increase, the intersymbol interference (ISI) becomes more severe as well, (i.e., the channel impulse response becomes longer). In read channel chips, a Viterbi detector is typically used to detect the read data bits in the presence of intersymbol interference and noise. When the channel impulse response is long, however, the hardware complexity associated with the Viterbi detector becomes prohibitively large, as the number of states considered by the Viterbi detector grows exponentially with the length of the channel impulse response. A number of techniques have been proposed or suggested for reducing the complexity of Viterbi detectors.

For example, the hardware complexity of the Viterbi detector can be reduced by using a reduced-state trellis that considers only a shortened impulse response, and canceling intersymbol interference due to the tail of the impulse response for each state by using past survivor symbols as local feedback. See, e.g., J. W. M. Bergmans, "Digital Baseband Transmission and Recording," Kluwer Academic Publishers, 326 (1996) or U.S. Pat. No. 6,690,754, issued to Haratsch et al., entitled "Method and Apparatus for Reducing the Computational Complexity and Relaxing the Critical Path of Reduced-State Sequence Estimation (RSSE) Techniques," incorporated by reference herein The error rate performance of reduced-state Viterbi detectors with local feedback can approach the performance of full-state Viterbi detectors without local feedback that implement maximum likelihood sequence estimation (MLSE). The maximum achievable data rate of a Viterbi detector implementation with local feedback, however, is considerably lower compared to a Viterbi detector implementation without local feedback, as significantly more operations have to be performed within one clock period. A need therefore exists for a method and apparatus for performing reduced-state Viterbi detection with local feedback at the high data rates that are required by evolving high-end storage applications.

SUMMARY OF THE INVENTION

Generally, a pipelined decision feedback unit (DFU) is disclosed for use in reduced-state Viterbi detectors with local feedback. The disclosed pipelined decision feedback unit improves the maximum data rate that may be achieved by the reduced state Viterbi detector by computing a number of partial intersymbol interference based estimates, where a partial intersymbol interference based estimate is either a partial intersymbol interference estimate or a partial intersymbol interference free signal estimate. A pipelined decision feedback unit is thus disclosed that computes a plurality of partial intersymbol interference based estimates, wherein at least one partial intersymbol interference-based estimate is based on a selected partial intersymbol interference-based estimate; and selects the selected partial intersymbol interference-based estimates from among the computed partial intersymbol interference-based estimates for path extensions into a state.

In one exemplary implementation, a pipelined decision feedback unit is disclosed for computing intersymbol interference-based estimates for a channel having a channel impulse response, comprising at least one functional unit for computing a partial intersymbol interference-based estimate. The functional unit comprises at least one multiplexer for selecting a partial intersymbol interference-based estimate from partial intersymbol interference-based estimates for path extensions into a state; at least one pipeline register for storing a partial intersymbol interference-based estimate; and at least one arithmetic circuit such as an adder or subtractor that accounts for intersymbol interference associated with at least one channel coefficient.

The disclosed method and apparatus can also be used in other applications, such as 1 Gigabit or 10 Gigabit Ethernet over copper applications.

A more complete understanding of the present invention, as well as further features and advantages of the present invention, will be obtained by reference to the following detailed description and drawings.

BRIEF DESCRIPTION OF THE DRAWINGS

FIG. 20 illustrates the one-dimensional and four-dimensional subset partitioning in 1000BASE-T Gigabit Ethernet;

FIG. 21 is a schematic block diagram showing the implementation of a reduced-state Viterbi detector for 1000BASE-T Gigabit Ethernet incorporating a pipelined DFU and BMU;

DETAILED DESCRIPTION

The present invention increases the maximum data rate that may be achieved by reduced-state Viterbi detectors. According to one aspect of the invention, a pipelined decision feedback unit is provided for a reduced state Viterbi detector that computes ISI-free signal estimates or ISI estimates based on partial ISI-based estimates, where a partial ISI-based estimate is computed using a selected partial ISI-based estimate, which is chosen among values for survivor path extensions into an associated state using an ACS decision. The partial ISI-based estimates are partial ISI estimates or partial ISI-free signal estimates. According to another aspect of the invention, partial ISI-free signal estimates or partial ISI estimates are computed in a pipelined fashion using a multiplexer network structure that corresponds to the structure of the trellis considered by the detector.

For a detailed discussion of reduced-state Viterbi detection with local feedback, which is also known as Reduced-State Sequence Estimation (RSSE), (Delayed) Decision-Feedback Sequence Estimation (DFSE), and Parallel Decision-Feedback Equalization (PDFE), see, for example, U.S. Pat. No. 6,690,754 to Haratsch et al., entitled "Method and Apparatus for Reducing the Computational Complexity and Relaxing the Critical Path of Reduced-State Sequence Estimation (RSSE) Techniques," incorporated by reference herein, and the references cited therein. See also, Lee and Messerschmidt, "Digital Communication," Kluwer Academic Publishers, $2^{nd}$ ed. (1994).

Figure 1:
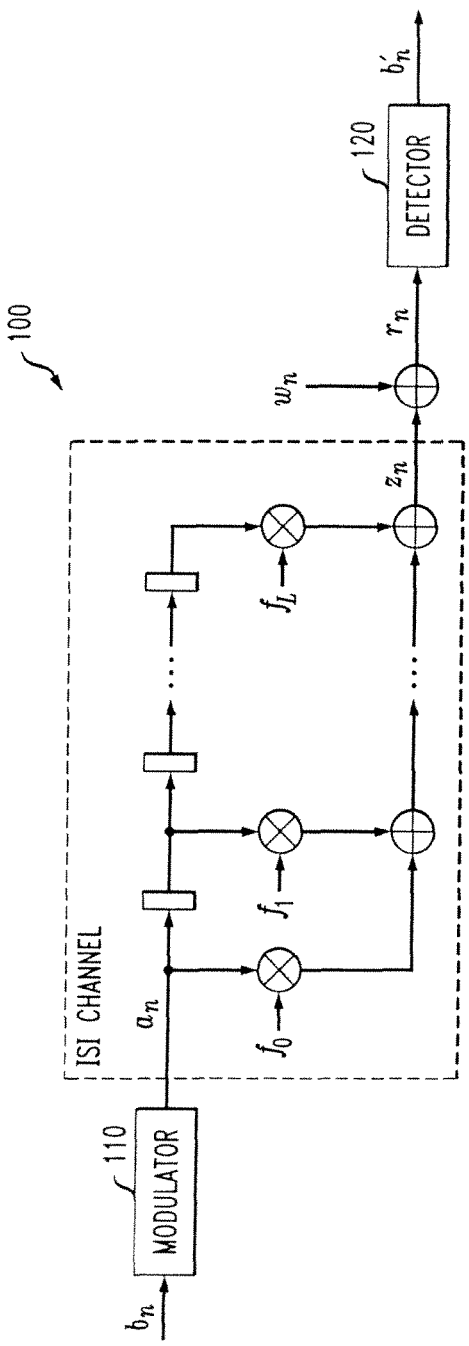
FIG. 1 is a schematic block diagram of a conventional system model for a communications channel with ISI and additive noise.

FIG. 1 is a schematic block diagram of a conventional system model for a communications channel 100 with ISI and additive noise. While the exemplary embodiment is discussed in the context of baseband communications, the techniques discussed herein can also be applied to passband communications systems, as would be apparent to a person of ordinary skill in the art. Further, while it is assumed in FIG. 1 that trellis-coded modulation (TCM) is not employed for ease of illustration, the disclosed techniques generalize to communication systems using TCM or other modulation schemes as shown further below.

The modulator 110 maps an information symbol $b_n$ into a channel symbol $a_n$. For ease of illustration, it is assumed that the number of information bits per information symbol is one. In other words, the information symbol $b_n$ is equivalent to a single information bit $b_n$. The modulator 110 maps an information symbol $b_n$ to a two-level channel symbol $a_n$, according to following rule:

$$a_n = \begin{cases} -1, & b_n = 0 \\ 1, & b_n = 1. \end{cases} \quad (1)$$

The techniques discussed herein can easily be applied to other modulation schemes and more than two signal levels as shown further below.

The ISI channel 100 is modeled as an FIR filter having a plurality of filter taps, each filter tap being associated with a channel coefficient, and the channel output at time n is given by $$r_n = z_n + w_n = \sum_{i=0}^{L} f_i \cdot a_{n-i} + w_n, \quad (2)$$

where $z_n$ is the ISI channel output, $\{f_i\}$, $0 \le i \le L$ are the channel coefficients, L is the channel memory, and $w_n$ is noise. The filter taps associated with channel coefficients $f_1, f_2, \ldots f_L$ are referred to as postcursor taps. The decision of a detector 120 that corresponds to $b_n$ is denoted by $b'_n$.

The ISI channel output $z_n$ depends on the current channel symbol $a_n$ and the past L transmitted channel symbols $\{a_{n-i}\}$, $1 \leq i \leq L$. This output can be described as a function of the L past transmitted channel symbols using a finite state machine (FSM) model, where the channel state at time n is defined by $$\alpha_n = (a_{n-1}, a_{n-2}, \ldots, a_{n-L}). \quad (3)$$

The channel state is equivalently defined in terms of the L past transmitted information bits:

$$\beta_n = (b_{n-1}, b_{n-2}, \ldots, b_{n-L}). \quad (4)$$

It is apparent from equations (3) or (4) that the number of channel states is given by $$2^L. \quad (5)$$

To simplify the notation, the integer value corresponding to the vector $(b_{n-1}, \ldots, b_{n-L+1}, b_{n-L})$ will be used to represent the channel state $\beta_n$. For example, $0_n$ will stand for $\beta_n = (0, \ldots, 0, 0)$, and $1_n$ will stand for $\beta_n = (0, \ldots, 0, 1)$.

Figure 2:
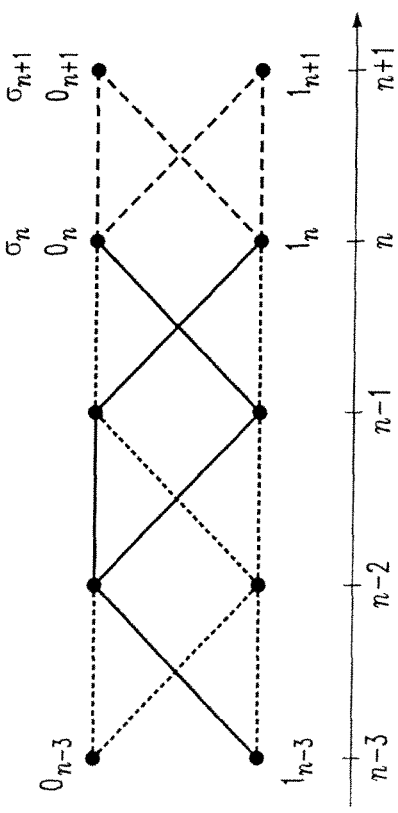
FIG. 2 illustrates a trellis diagram for a channel with memory L=1.

The FSM process describing the ISI channel 100 can be visualized using a trellis diagram 200, shown in FIG. 2, for a channel with memory L=1. For the considered exemplary uncoded channel model, a trellis state at time n is denoted by $\tau_n$, and is equal to the channel state, i.e., $\sigma_n = \beta_n$. In FIG. 2, solid lines correspond to survivor paths, dotted lines to discarded transitions, and dashed lines to path extensions. There are two channel states, and two branches corresponding to the information symbols $b_n=0$ and $b_n=1$ leave each state $\sigma_n$ to reach respective successor states $\{\sigma_{n+1}\}$. It can be seen from equation (5) that the number of channel states grows exponentially with respect to the channel memory.

FIG. 2 depicts the operation of the Viterbi algorithm at time step n. At this point, the Viterbi algorithm has already determined the survivor path into state $0_n$, which corresponds to the surviving state sequence $\{0_n, 1_{n-1}, 0_{n-2}, 1_{n-3}, \ldots\}$. The survivor path into state $1_n$ corresponds in this example to the state sequence $\{1_n, 0_{n-1}, 0_{n-2}, 1_{n-3}, \ldots\}$. Based on these two survivor paths, the Viterbi algorithm decides on the survivor paths into states $0_{n+1}$ and $1_{n+1}$, in the manner described below.

First, the Viterbi algorithm calculates branch metrics for the state transitions from $\sigma_n$ to $\sigma_{n+1}$. For a channel with additive white Gaussian noise, the optimum branch metric is the Euclidean distance between the received symbol $r_n$ and the ideal ISI channel output $z_n$ that corresponds to the respective state transition. For a transition from state $\sigma_n$, the branch metric is given by $$\lambda_n(\sigma_n, a_n) = (r_n - z_n)^2 = \left( r_n - \sum_{i=0}^{L} f_i \cdot a_{n-i} \right)^2, \quad (6)$$

where $a_n$ is the channel symbol that is associated with a transition from state $\sigma_n$ to a successor state $\sigma_{n+1}$. The techniques described herein are independent from the way branch metrics are computed, i.e., branch metrics can also by computed by using the absolute value of the difference between the received symbol $r_n$ and the ideal ISI channel output $z_n$.

In the trellis 200 of FIG. 2, there are two path extensions into any state $\sigma_{n+1}$, e.g., state $0_{n+1}$ can be reached from states $0_n$ and $1_n$. Out of the two path extensions into a particular state $\sigma_{n+1}$, the Viterbi algorithm keeps only the one extension with the smallest path metric, as it corresponds to the most likely path into this state. The metric for the path that emanates from state $\sigma_{n+1}$ and leads into $\sigma_{n+1}$ is calculated by adding the path metric for the preceding state $\sigma_n$, $\Gamma_n(\sigma_n)$ and the branch metric $\lambda_n(\sigma_n, a_n)$ for the transition.

The three operations to determine the best survivor path into a new state $\sigma_{n+1}$, i.e., adding up corresponding path metrics of predecessor states $\sigma_n$ and branch metrics for the extensions into the new state $\sigma_{n+1}$, comparing the path metrics of these extended sequences, and selecting the extension with the minimum path metric as the survivor sequence for the new state, are referred to as add-compare-select (ACS), which can be described by the following equation:

$$\Gamma_{n+1}(\sigma_{n+1}) = \min_{\{\sigma_n\} \to \sigma_{n+1}} (\Gamma_n(\sigma_n) + \lambda_n(\sigma_n, a_n)). \quad (7)$$

As previously indicated, the invention can also be applied when branch metrics are computed differently. As known in the art, for certain branch metric definition, the best path into a state is given by the path with the maximum (instead of minimum) path metric. For such cases, the ACS operation described by equation (7) involves a maximum instead of a minimum operation.

In the example of FIG. 2, the two survivor sequences into states $0_n$ and $1_n$ merge into a single path at time step n−2. In general, all survivor paths merge into a single path after some detection delay D with high probability. Thus, information symbols can be uniquely detected from this time step on. Therefore, it is possible to implement the Viterbi algorithm with a fixed detection delay. It is not required to process the whole transmitted sequence before the first information symbols can be detected. Generally, the detection delay D should be approximately five times the memory of the underlying FSM process. For ISI channels, the memory is equal to L. Typically, a good value for D is determined by running error rate simulations for different values of D.

Figure 3:
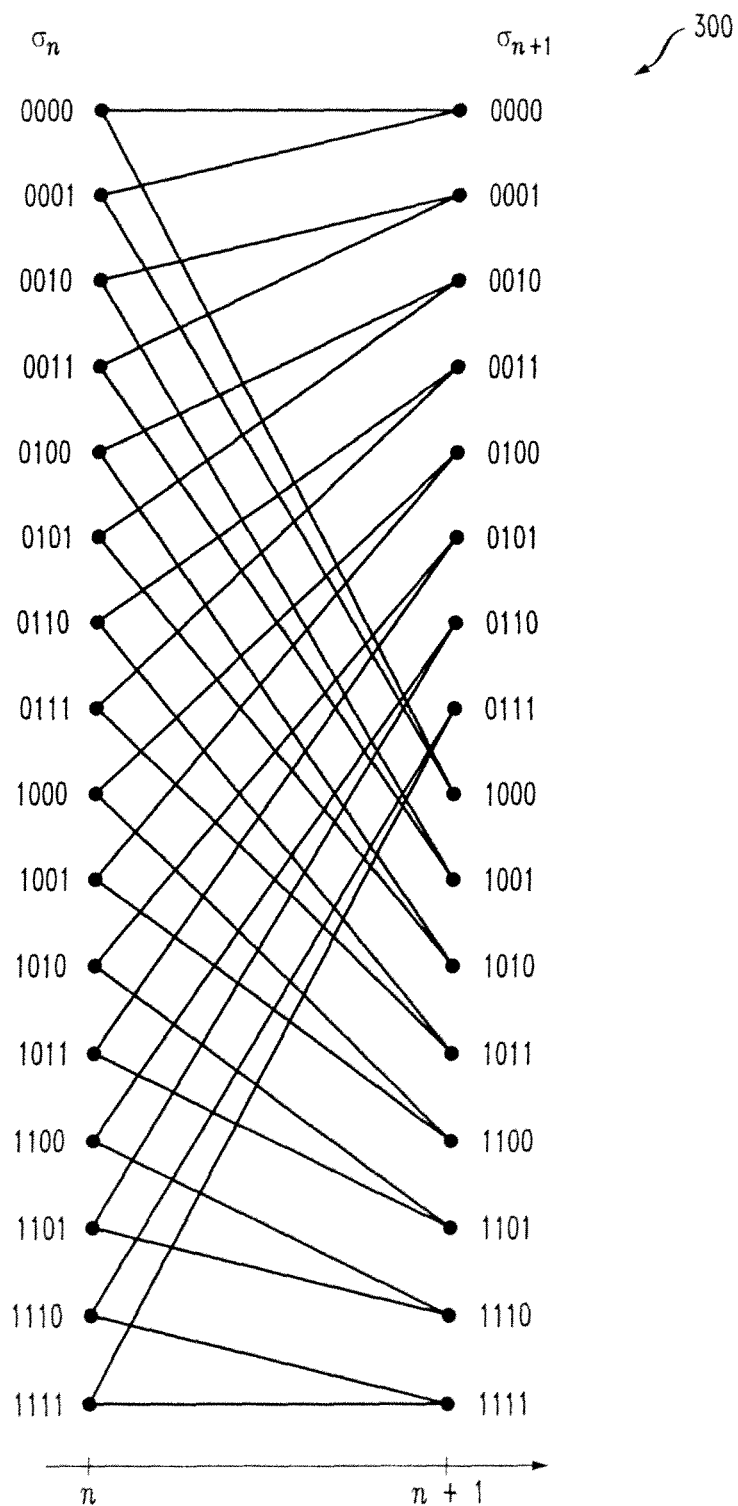
FIG. 3 illustrates a trellis diagram for a channel having a memory L=4.

FIG. 3 illustrates a trellis 300 describing an ISI channel having a memory L=4. A trellis state at time n is denoted by $\sigma_n$, and for the considered exemplary uncoded channel model, it is equal to the channel state, i.e., $\sigma_n = \beta_n$. There are 16 channel states, and two branches corresponding to the information symbols $b_n=0$ and $b_n=1$ leave each state $\sigma_n$ to reach respective successor states $\{\sigma_{n+1}\}$.

Reduced-State Viterbi Detection with Local Feedback

As indicated above, the disadvantage of MLSE is that its complexity grows exponentially with the channel memory. Considering fewer states for the detection of the most likely data sequence reduces the required hardware or computational effort. Reduced-state Viterbi Detection with local feedback accomplishes this by merging several separate states into one single reduced state and keeping only one survivor path per reduced state. The ISI that is not considered in the reduced state is cancelled for each reduced-state by using channel symbols from the corresponding survivor path in a local feedback fashion. Reduced-state Viterbi detection with local feedback is also known as "Reduced-State Sequence Estimation (RSSE)", "(Delayed) Decision-Feedback Sequence Estimation", "Parallel Decision-Feedback Equalization", etc.

In the simplest variant of RSSE, a reduced state $\beta'_n$ is obtained by not considering all L information symbols, but only the past K information symbols for the definition of a trellis state:

$$\beta'_n = (b_{n-1}, b_{n-2}, \ldots, b_{n-K}), \; 0 \leq K \leq L, \quad (8)$$

where K is referred to as the truncated channel memory. The number of states in the reduced-state trellis is then given by $$2^K. \quad (9)$$

The reduced state $\beta'_n$ does not contain information about the ISI caused by the channel symbols $(a_{n-K-1}, a_{n-K-2}, \ldots, a_{n-L})$. Conceptually, this reduced state is obtained by grouping all original states $\beta_n$ as defined in Equation (4) with the same information symbol sequence $(b_{n-1}, b_{n-2}, \ldots, b_{n-K})$, but different sequences $(b_{n-K-1}, b_{n-K-2}, \ldots, b_{n-L})$ into one single reduced state $\beta'_n$. Therefore, this reduced state does not make any statement about the ISI associated with the channel coefficients $(f_{K+1}, f_{K+2}, \ldots, f_L)$. But an estimate for this ISI component can be computed by considering the respective channel symbols from the survivor sequence into this state. The ISI corresponding to a state is not known a-priori as in MLSE, but must be determined at each detection step by using channel symbols from the corresponding survivor path. Let $\sigma_n$ denote a state in the reduced-state trellis, i.e., $\sigma_n = \beta'_n$. The ISI estimate $u_n(\sigma_n)$ for a state $\sigma_n$ is calculated at time step n as $$u_n(\sigma_n) = \sum_{i=1}^{K} f_i \cdot a_{n-i} + \sum_{i=K+1}^{L} f_i \cdot \hat{a}_{n-i}(\sigma_n), \qquad (10)$$

where $\hat{a}_{n-i}(\sigma_n)$ is the channel symbol that corresponds to the survivor sequence into state $\sigma_n$ and that is associated with trellis step n-i. The first term on the right hand side of equation (10) computes the ISI component that is known a-priori due to the definition of the reduced state in equation (8). The second term on the right hand side of equation (10) is the ISI component caused by channel taps that were ignored in the reduced-state definition of equation (8). This ISI term is calculated at each detection step for a given state by using respective survivor symbols as local feedback.

With the ISI estimate $u_n(\sigma_n)$, the branch metric for the transition that emanates from state $\sigma_n$ to reach a successor state $\sigma_{n+1}$ and corresponds to channel symbol $a_n$ can be computed as:

$$\lambda_n(\sigma_n, a_n) = (r_n - f_0 \cdot a_n - u_n(\sigma_n))^2. \qquad (11)$$

As in MLSE, the most likely survivor path into the state $\sigma_{n+1}$ with the path metric $\Gamma_{n+1}(\sigma_{n+1})$ among the path extensions from all possible predecessor states $\{\sigma_n\}$ is determined with an ACS operation:

$$\Gamma_{n+1}(\sigma_{n+1}) = \min_{\{\sigma_n\} \to \sigma_{n+1}} (\Gamma_n(\sigma_n) + \lambda_n(\sigma_n, a_n)). \qquad (12)$$

The version of RSSE where a reduced state is defined by considering just a truncated channel memory as in equation (8) is referred to as (Delayed) Decision-Feedback Sequence Estimation (DFSE), described, for example, in A. Duel-Hallen and C. Heegard, "Delayed Decision-Feedback Sequence Estimation," IEEE Transaction on Communications, 428-436 (May 1989). A reduced-state trellis can also be constructed by applying set partitioning principles to the channel symbol alphabet, as suggested in M. V. Eyuboglu and S. U. Qureshi, "Reduced-State Sequence Estimation With Set Partitioning and Decision-Feedback," IEEE Transactions on Communications, 13-20 (January 1988). Recently, even more general rules for the definition of reduced states were given in B. E. Spinnler and J. Huber, "Design of Hyper States for Reduced-State Sequence Estimation,", AEÜ (Electronics and Communication), 17-26 (1996). The present invention can be applied to such general RSSE methods. In addition, the present invention can be applied to another subclass of RSSE, referred to as Parallel Decision-Feedback Equalization, described in Lee and Messerschmidt, "Digital Communication," $2^{nd}$ ed. (1994). These publications are each incorporated by reference herein.

Figure 4:
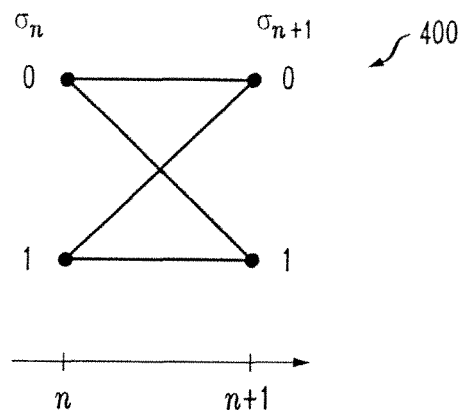
FIG. 4 illustrates a reduced-state trellis diagram corresponding to the full-state trellis of FIG. 3, for a channel having a memory L=4 and a shortened channel memory K=1.

Now, RSSE will be explained for the case that L=4 and K=1. Then, a state in the reduced-state trellis is defined according to equation (8) as:

$$\beta'_n = (b_{n-1}) \qquad (13)$$

and the number of states in the reduced-state trellis is equal to $2^1 = 2$. FIG. 4 illustrates the reduced-state trellis 400 corresponding to the full state trellis 300 of FIG. 3 that describes an ISI channel having a memory L=4. A state at time n in the reduced-state trellis is denoted by $\sigma_n$, i.e., $\sigma_n = \beta'_n$. There are two channel states, and two branches corresponding to the information symbols $b_n = 0$ and $b_n = 1$ leave each state $\sigma_n$ to reach respective successor states $\{\sigma_{n+1}\}$.

Figure 5:
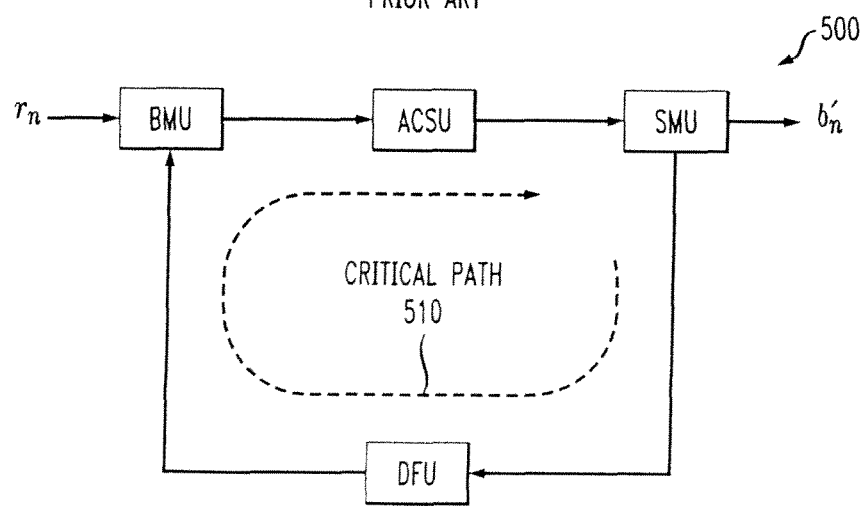
FIG. 5 is a schematic block diagram for an exemplary conventional reduced-state Viterbi detector with local feedback.

FIG. 5 is a schematic block diagram for an exemplary conventional reduced-state Viterbi detector 500 with local feedback. As shown in FIG. 5, the reduced-state detector 500 includes a decision-feedback unit that computes separate ISI estimates for each trellis state according to equation (10) using local feedback, a branch metric unit (BMU) that computes branch metrics for all transitions, an add-compare-select unit (ACSU) that determines the best survivor path into each state, and a survivor memory unit (SMU) that stores the survivor paths.

As shown in FIG. 5, due to the local feedback the critical path 510 is comprised of a recursive loop that includes each of the processing blocks (i.e., the BMU, ACSU, SMU and DFU). As all operations along this critical path 510 have to be performed within one clock period, this recursive loop limits the maximum achievable data rate. Therefore, the maximum data rate of a reduced-state Viterbi detector with local feedback is significantly lower than the maximum data rate of a Viterbi detector without local feedback, which is only limited by the ACS function.

Figure 6:
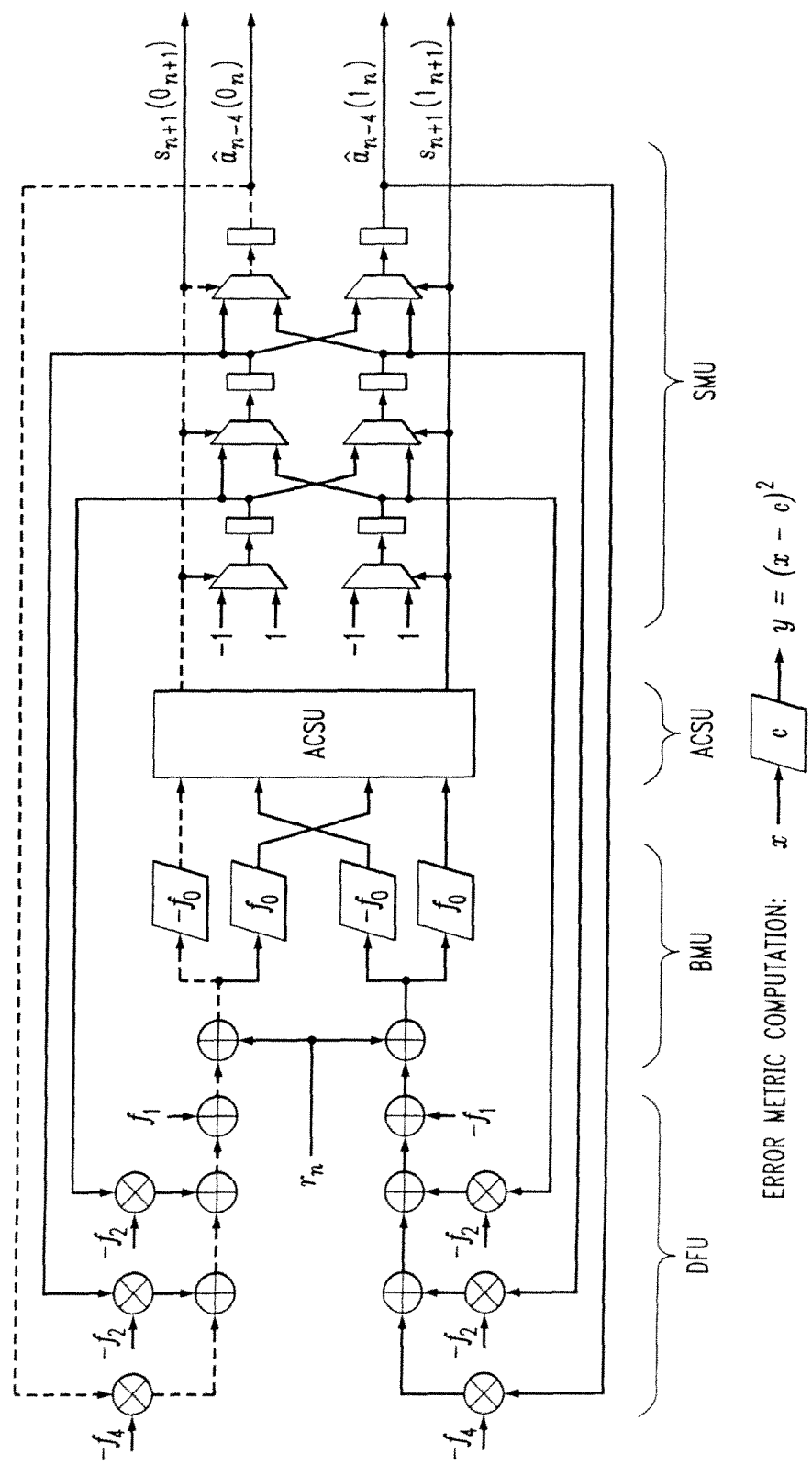
FIG. 6 illustrates a detailed state-parallel implementation of a reduced-state Viterbi detector with local feedback corresponding to the trellis of FIG. 4.

FIG. 6 illustrates a detailed state-parallel reduced-state Viterbi detector implementation 600 with local feedback corresponding to the trellis 400 of FIG. 4, having a memory L=4 and a shortened channel memory K=1. $\hat{a}_{n-4}(0_n)$ is the survivor symbol for time step n-4 from the survivor path into state $0_n$. $s_{n+1}(0_{n+1})$ is the ACS decision for the two path extensions into state $0_{n+1}$. The part of the SMU that stores the L-K survivor symbols $\hat{a}_{n-K-1}(\sigma_n), \hat{a}_{n-K-2}(\sigma_n), \ldots \hat{a}_{n-L}(\sigma_n)$ for each reduced state is implemented with a register-exchange-architecture, as these decisions are required for the computation of ISI estimates in the DFU without delay. The implementation of the SMU using a register-exchange architecture is described, e.g., in R. Cypher and C. B. Shung, "Generalized Trace-Back Techniques for Survivor Memory Management in the Viterbi Algorithm," Journal of VLSI Signal Processing, 85-94 (1993). Because the discussed exemplary channel uses two signal levels, the multipliers in the DFU can be implemented with a shift operation. The squaring operation for the Euclidean distance computation in the BMU can be approximated using random logic or a look-up table.

Reduced-state Viterbi detection with local feedback that implements, e.g., RSSE, is associated with less computational complexity than full-state Viterbi detection that implements MLSE for the same channel memory L, as it processes less states. However, this comes at the expense of a significantly longer critical path, which is drawn in FIG. 6 using dotted lines. The critical path comprises one symbol multiplication and L-K additions in the DFU (the first term in the right hand side of equation (10) can be computed outside the loop), one addition, subtraction and squaring operation in the BMU, one add-compare in the ACSU, and a 2-to-1 MUX in the SMU. All the operations along this critical path must be completed within one symbol period and cannot be pipelined. In contrast to this, the critical path in a Viterbi detector just comprises the ACS operation. Therefore, the maximum data rate of a reduced-state Viterbi detector implementation with local feedback is potentially significantly lower compared to a Viterbi detector that performs MLSE. Furthermore, the maximum throughput of a reduced-state Viterbi detector implementation with local feedback depends on the channel memory such that it decreases for increasing L.

Reduced-State Viterbi Detector Implementation with Pipelined DFU

Figure 7:
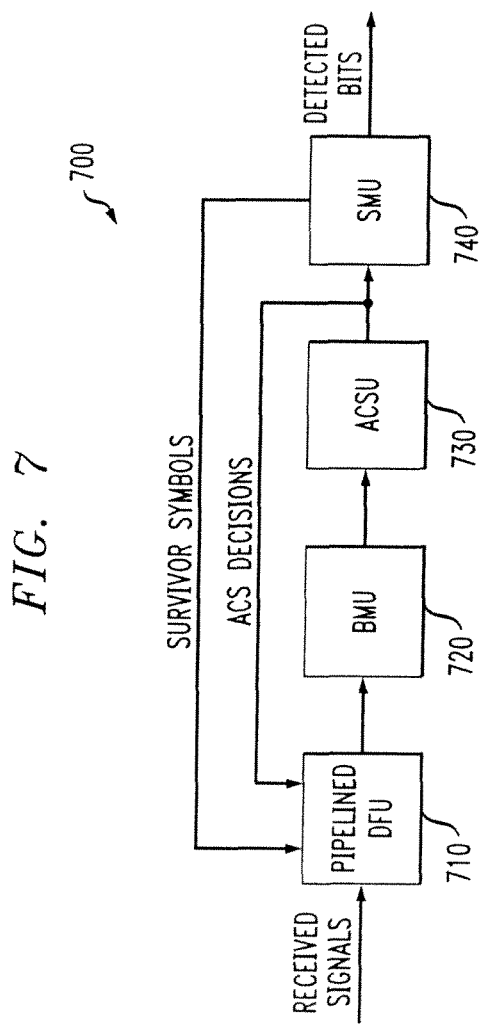
FIG. 7 is a schematic block diagram of a reduced-state Viterbi detector that incorporates a pipelined decision-feedback unit (DFU)

The maximum data rate of a reduced-state Viterbi detector implementation with local feedback can be improved by pre-computing all possible branch metrics as disclosed in U.S. patent application Ser. No. 10/853,089, entitled "Method and Apparatus for Precomputation and Pipelined Selection of Branch Metrics in a Reduced-State Viterbi Detector." However, precomputing all possible branch metrics becomes very expensive when the channel memory L is large, as the number of branch metric candidates grows exponentially with the number of postcursors. Calculating partial ISI-based estimates for partial survivor paths and selecting the estimates that correspond to selected survivor paths based on ACS decisions in a pipelined fashion can shorten the critical path of an reduced-state Viterbi detector implementation with less hardware cost. The partial ISI-based estimates are either ISI estimates or ISI-free signal estimates. The architecture for such a reduced-state Viterbi detector implementation is shown in FIG. 7. Most or all of the ISI estimation is not part of the critical path in this architecture, while the hardware overhead associated with the pipelined computation of partial ISI-based estimates is a linear function of the channel memory L.

FIG. 7 is a schematic block diagram of a reduced-state Viterbi detector 700 incorporating features of the present invention. As shown in FIG. 7, the reduced-state Viterbi detector 700 includes a pipelined decision-feedback unit 710, a branch metrics unit 720, an add-compare-select unit 730 and a survivor memory unit 740. According to one aspect of the invention, the pipelined decision-feedback unit 710 computes partial ISI estimates or partial ISI-free signal estimates for partial survivor paths in a pipelined fashion. A partial ISI estimate or partial ISI-free signal estimate that corresponds to a selected survivor path is selected based on an ACS decision. The branch metrics unit 720 computes branch metrics for all transitions using ISI based estimates, where the ISI based estimates are partial ISI estimates or ISI-free signal estimates that account for all postcursor taps. The add compare select unit 730 determines the best survivor path into each state. The survivor memory unit 740 stores the survivor paths.

Implementation of the DFU with One Pipelining Stage

Partial ISI estimates that correspond to transitions from time n to time n+1 can be precomputed at time n−1 based on survivor symbols from paths into states at time n−1. A partial ISI estimate that accounts for channel coefficients $f_{K+1}$, $f_{K+2}, \ldots f_L$ and is based on symbols from the survivor path into state $\sigma_{n-1}$ is given by:

$$u'_n(\sigma_{n-1}, [K+1, L]) = \sum_{i=K+1}^{L} f_i \cdot \hat{a}_{n-i}(\sigma_{n-1}). \quad (14)$$

A partial ISI estimate that accounts for channel coefficients $f_{K+1}$, $f_{K+2}, \ldots f_L$ and is based on symbols from the survivor path into state $\sigma_n$ is given by:

$$u'_n(\sigma_n, [K+1, L]) = \sum_{i=K+1}^{L} f_i \cdot \hat{a}_{n-i}(\sigma_n) \quad (15)$$

This partial ISI estimate can be selected among partial ISI estimates that have been computed according to (14). The selection is done among the values that are associated with predecessor states $\sigma_{n-1}$ of $\sigma_n$ using the ACS decision for the survivor path into $\sigma_n$:

$$u'_n(\sigma_n, [K+1, L]) = \underset{\{\sigma_{n-1}\} \to \sigma_n}{sel} \{u'_n(\sigma_{n-1}, [K+1, L])\}. \quad (16)$$

For example, for L=4 and K=1, the partial ISI estimate for state $0_n$ at time n, $u'_n(0_n,[2,4])$ is obtained by selecting either $u'_n(0_{n-1},[2,4])$ or $u'_n(1_{n-1},[2,4])$ dependent on the ACS decision $s_n(0_n)$.

An ISI estimate that accounts for all postcursors is given by the addition of the selected partial ISI estimate and the ISI term associated with the channel coefficients $f_1, f_2, \ldots f_K$:

$$u_n(\sigma_n) = u'_n(\sigma_n, [K+1, L]) + \sum_{i=1}^{K} f_i \cdot a_{n-i}. \quad (17)$$

The channel symbols in the second term on the right hand side of (17) are determined by the reduced state $\sigma_n$. The ISI estimate $u_n(\sigma_n)$ is used to compute a branch metric according to (11).

In an alternative implementation, partial ISI-free signal estimates instead of partial ISI estimates are computed, where the partial ISI-free signal estimates $q'_n$ and the ISI-free signal estimates $q_n$ are defined by following equations:

$$q'_n(\sigma_{n-1}, [K+1, L]) = r_n - \sum_{i=K+1}^{L} f_i \cdot \hat{a}_{n-i}(\sigma_{n-1}), \quad (18)$$

$$q'_n(\sigma_n, [K+1, L]) = \underset{\{\sigma_{n-1}\} \to \sigma_n}{sel} \{q'_n(\sigma_{n-1}, [K+1, L])\}. \quad (19)$$

$$q_n(\sigma_n) = q'_n(\sigma_n, [K+1, L]) - \sum_{i=1}^{K} f_i \cdot a_{n-i}, \quad (20)$$

and branch metrics are computed according to:

$$\lambda_n(\sigma_n, a_n) = (q_n(\sigma_n) - f_0 \cdot a_n)^2. \quad (21)$$

By computing partial ISI-free signal estimates instead of partial ISI estimates in the pipelined DFU, the critical path can be shortened, as the branch metric computation need not account for the received signal $r_n$ anymore. The invention applies to both the computation of partial ISI estimates or partial ISI-free signal estimates in the pipelined DFU.

As the partial ISI-based estimates are calculated one time step in advance, a pipeline stage can be inserted between the computation of the partial ISI-based estimates and the branch metrics, cutting the critical path into two parts. When L−K is not large, the maximum throughput is just limited by the delay of one addition, the error metric computation, an add-compare in the ACSU, and a 2-to-1 multiplexer. The computation of the ISI-based estimates, which causes a delay proportional to L−K in a conventional reduced-state Viterbi detector implementation, is not part of the critical path anymore.

Figure 8:
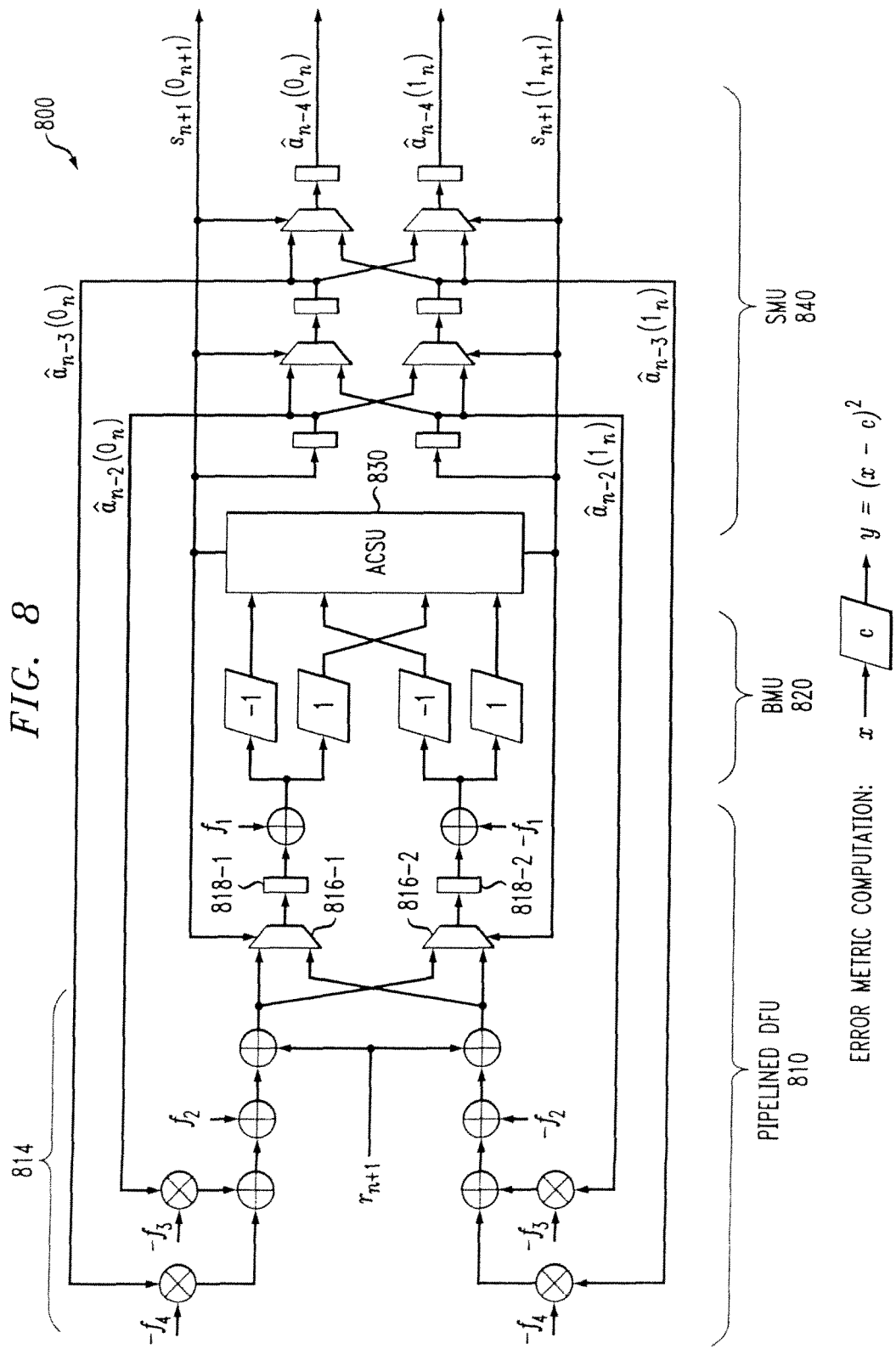
FIG. 8 is a schematic block diagram showing the implementation of the reduced-state Viterbi Detector of FIG. 7 with one pipelining stage in the DFU.

FIG. 8 is a schematic block diagram showing an exemplary reduced-state Viterbi Detector 800 that is an implementation of FIG. 7. FIG. 8 shows the pipelined computation of ISI-free signal estimates, where L=4 and K=1. The reduced-state Viterbi Detector 800 has one pipelining stage in the DFU 810. As shown in FIG. 8, the pipelined decision-feedback unit 810 includes a circuit stage 814 that computes two partial ISI free signal estimates for the two states. The circuit stage 814 comprises a number of multipliers and adders. The multipliers and adders of the circuit stage 814 implement equation (14) and (18). It is noted that the multipliers for the higher order channel coefficients $f_4$ and $f_3$ receive survivor symbols for each state from the survivor memory unit 840.

The two partial ISI free signal estimates are applied to corresponding selectors 816-1 and 816-2 that select a partial ISI free signal estimate using an ACS decision according to equation (19). The inputs into each selector for a state are the partial ISI free signal estimates for the survivor path extensions into this state. The pipelined decision-feedback unit 810 includes one pipeline stage with a pipeline register 818-1 and 818-2 for each state. Equation (20) is implemented by the adders that add $f_1$.

The branch metrics unit 820 is comprised of a number of elements that compute branch metrics according to equation (21). The add compare select unit 830 determines the best survivor path into each state. For a more detailed discussion of a suitable add-compare-select unit 830, see, for example, U.S. patent application Ser. Nos. 10/853,087, 10/853,088, 10/853,089, and 10/853,090, each filed May 25, 2004, and incorporated by reference herein. The survivor memory unit 840 implements a register exchange architecture to generate the survivor symbols for each state.

Implementation of the DFU with Multiple Pipelining Stages

When L−K is large, the delay caused by the computation of the partial ISI estimate $u'_n(\sigma_{n-1},[K+1,L])$ or partial ISI-free signal estimate $q'_n(\sigma_{n-1},[K+1,L])$ according to (14) or (18) can become so significant that this operation determines the critical path. However, it is possible to pipeline the computation of the partial ISI-based estimates further. Partial ISI estimates that are required for branch metrics associated with transitions from time n to time n+1 can already be calculated at time n−M, where 1≤M≤L−K.

A partial ISI estimate that accounts for channel coefficient $f_{M+1}, f_{M+2}, \ldots f_L$, and uses information associated with state $\sigma_{n-M}$ available at time n−M is given by $$u'_n(\sigma_{n-M}, [M+1, L]) = \sum_{i=M+1}^{M+K} f_i \cdot a_{n-i} + \sum_{i=M+K+1}^{L} f_i \cdot \hat{a}_{n-i}(\sigma_{n-M}). \quad (22)$$

Note that the K channel symbols used in the first term on the right hand side of this equation are determined by the channel state $\sigma_{n-M}$, and L−M−K symbols from the survivor path into this state are used in the second term on the right hand side of (22). The partial ISI estimate $u'_n(\sigma_{n-M},[M+1,L])$ can be computed M time steps in advance.

Based on the computed partial ISI estimates $u'_n(\sigma_{n-M},[M+1,L])$ and the ACS decisions for survivor paths into states at the subsequent time step n−M+1, partial ISI estimates can be determined that are based on updated survivor path information. The new partial ISI estimate $u'_n(\sigma_{n-M+1},[M+1,L])$ can be selected among the computed ones that correspond to predecessor states of $\sigma_{n-M+1}$:

$$u'_n(\sigma_{n-M+1}, [M+1, L]) = \underset{\{\sigma_{n-M}\}\to\sigma_{n-M+1}}{sel} \left\{ u'_n\left( \begin{array}{c} \sigma_{n-M}, \\ [M+1, L] \end{array} \right) \right\}, \quad (23)$$

where the selection is done based on the ACS decision $s_{n-M+1}(\sigma_{n-M+1})$.

The computation and selection of updated partial ISI estimates can be continued by accounting recursively for the remaining channel coefficients according to following equations, where 1≤i≤M−1:

$$u'_n(\sigma_{n-i}, [i+1, L]) = u'_n(\sigma_{n-i}, [i+2, L]) + f_{i+1} \cdot a_{n-i-1}, \quad (24)$$

$$u'_n(\sigma_{n-i+1}, [i+1, L]) = \underset{\{\sigma_{n-i}\}\to\sigma_{n-i+1}}{sel} \{u'_n(\sigma_{n-i}, [i+1, L])\}. \quad (25)$$

Equation (24) adds the ISI associated with channel coefficient $f_{i+1}$ to the previously computed and selected partial ISI estimate. The channel symbol $a_{n-i-1}$ is determined by the state $\sigma_{n-i}$. The selection in (25) is done based on the ACS decision for state $\sigma_{n-i+1}$, i.e., $s_{n-i+1}(\sigma_{n-i+1})$.

Finally, the ISI estimate for state $\sigma_n$ that accounts for all postcursor taps $f_1, f_2, \ldots f_L$, and corresponds to symbols from the survivor path into this state is computed according to:

$$u_n(\sigma_n) = u'_n(\sigma_n, [1,L]) = u'_n(\sigma_n, [2,L]) + f_1 \cdot a_{n-1}. \quad (26)$$

This ISI estimate is used to compute a branch metric according to (11). As the computation of this ISI estimate started M time units in advance, M pipeline stages can be inserted in a hardware implementation.

Figure 9:
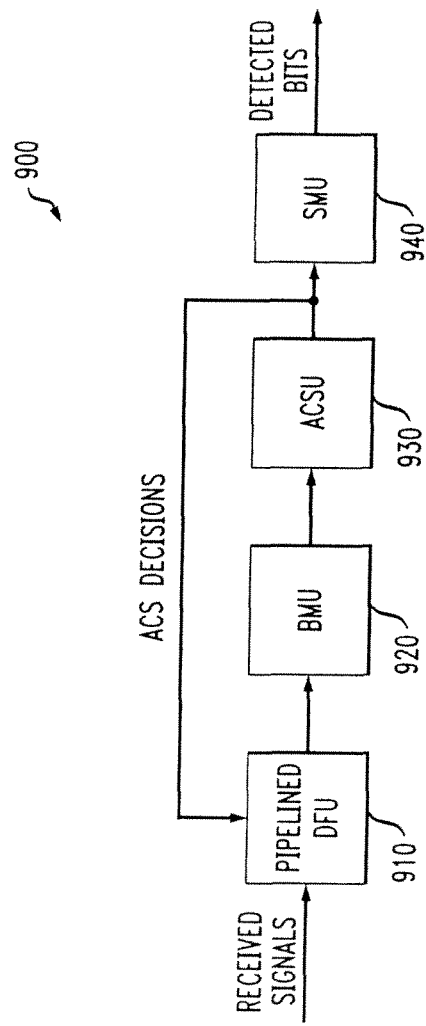
FIG. 9 is a schematic block diagram of an alternate reduced-state Viterbi detector that incorporates a pipelined decision-feedback unit.

FIG. 9 is a schematic block diagram of an alternate reduced-state Viterbi detector 900 that incorporates a pipelined decision-feedback unit 910. As shown in FIG. 9, the pipelined decision-feedback unit 910 includes enough pipelining stages so that the survivor symbols from the survivor memory unit 940 no longer need to be fed back to the pipelined decision-feedback unit 910.

Figure 10:
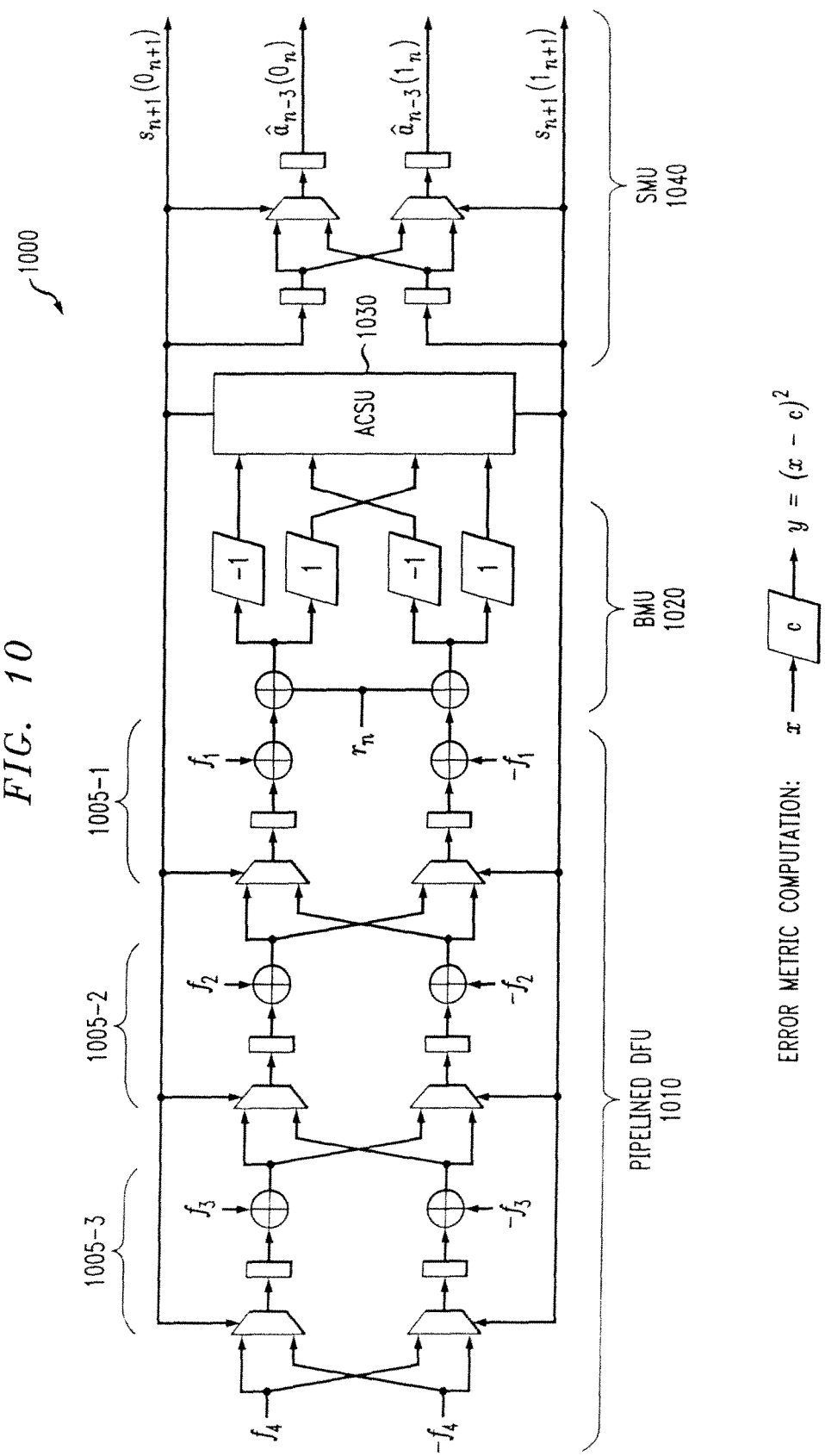
FIG. 10 is a schematic block diagram showing the implementation of the reduced-state Viterbi Detector of FIG. 9 with three pipelining stages in the DFU.

FIG. 10 is a schematic block diagram showing an exemplary reduced-state Viterbi Detector 1000 that is an implementation of FIG. 9, where L=4, K=1 and M=3. When the parameter M equals L−K as it is the case here, the computation of ISI estimates is fully pipelined, i.e., each addition of an ISI term is associated with a pipeline stage. In this case also the pipelined DFU does not require survivor symbol information to compute ISI estimates as shown in FIG. 9 and FIG. 10.

The reduced-state Viterbi Detector 1000 has three pipelining stages in the DFU 1010. As shown in FIG. 10, the pipelined decision-feedback unit 1010 three identical functional units 1005 that collectively compute two partial ISI estimates per unit corresponding to the two states. Each functional unit 1005 includes an adder, pipeline register and selector for each state. It is again noted that because of increased pipelining (relative to FIG. 8), the survivor symbols are no longer fed back to the circuits associated with the higher order channel coefficients.

A partial ISI estimate that accounts for $f_4$ is computed according to (22), and a corresponding new partial ISI estimate is selected according to (23). Partial ISI estimates that account also for $f_3$ and $f_2$ are computed in accordance with Equation (24) and the selection of corresponding new values from among the path extensions into an associated state is performed in accordance with Equation (25). Equation (26) addresses the computation of a partial ISI estimate that accounts also for coefficient $f_1$, and this partial ISI estimate is in fact an ISI estimate for an associated state, as it accounts for all postcursor channel coefficients. The branch metrics are computed in accordance with (11). It is noted that the pipelined DFU 1010 computes the negative values of the partial ISI estimates and ISI estimates, i.e. $-u'_n$ and $-u_n$ without departing from the spirit of the invention. Also, as it is apparent to a person of skill in the art, subtractors can be used in the functional units 1005-3, 1005-2, 1005-1 instead of adders in the pipelined DFU to account for the ISI associated with the additional channel coefficients $f_3$, $f_2$ and $f_1$ after trivial arithmetic modifications to the equations shown in this section.

The connection network in front of each column of multiplexers in FIG. 10 reflects the topology of the underlying trellis and also the connection network in front of the columns of multiplexers in a register-exchange SMU. The architecture of the pipelined DFU 1010 is similar to the architecture of a register-exchange implementation of an SMU, such as the SMU 1040. In contrast to a register-exchange SMU implementation, the pipelined DFU architecture 1010 includes one arithmetic circuit such as an adder or subtractor per register that accounts for the ISI term associated with at least one channel coefficient, and the registers store partial ISI estimates and not survivor symbols.

In contrast to a conventional DFU implementation as shown in FIG. 6, the data path is regular with local connections. Only the ACS decisions are global signals, while survivor symbols have to be fed back from the SMU to the DFU in conventional reduced-state Viterbi detector architecture, potentially causing long wire delays. The computation of partial ISI estimates in 1005-3 and 1005-2 is outside the critical path, and the overall throughput is only limited by two additions, the error metric computation, an add-compare and a selection. In this architecture, additional hardware is only required for the multiplexers, the number of which scales linearly with the precomputation depth M.

The pipelined DFU of FIG. 10 can be implemented with carry-save arithmetic to save power, where the conversion to a non-redundant number system can be done before the final pipeline stage associated with channel coefficient $f_1$.

As the survivor symbols in the SMU are not required for the computation of the ISI estimates, the SMU can be implemented in a trace-back fashion to save power if detection latency is not a concern, as discussed further below in the section entitled "Trace-Back Survivor Memory."

Figure 11:
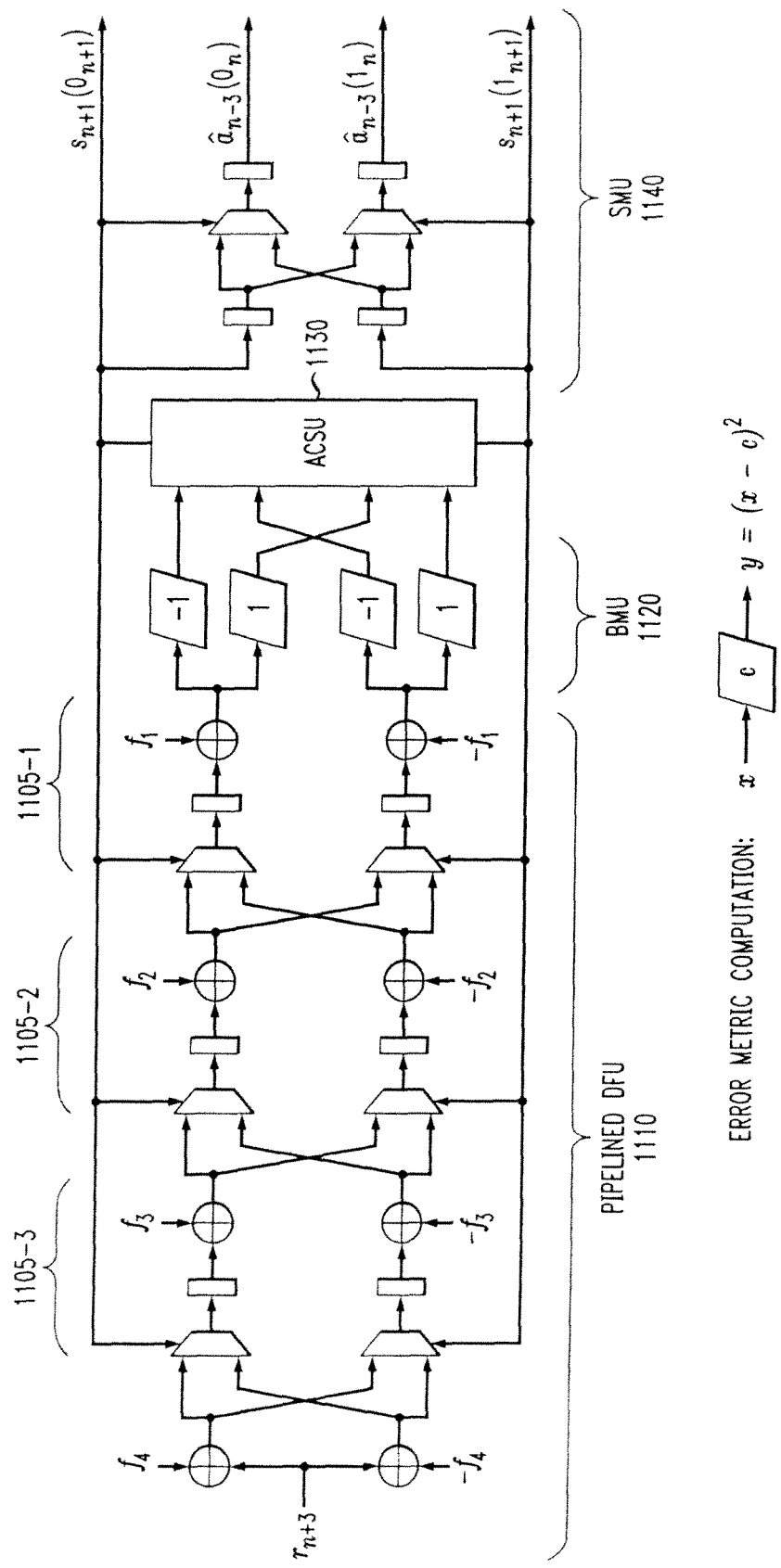
FIG. 11 is a schematic block diagram showing an alternate implementation of the reduced-state Viterbi Detector of FIG. 9 with three pipelining stages in the DFU.

FIG. 11 is a schematic block diagram showing an exemplary reduced-state Viterbi Detector 1100 that is an alternate implementation of FIG. 9, where L=4, K=1 and M=3. The reduced-state Viterbi Detector 1100 has three pipelining stages in the DFU 1110, in a similar manner to FIG. 10. The reduced-state Viterbi Detector 1100 computes ISI-free signal estimates, which are defined as follows:

$$q'_n(\sigma_{n-M}, [M+1, L]) = r_n - \sum_{i=M+1}^{M+K} f_i \cdot a_{n-i} - \sum_{M+K+1}^{L} f_i \cdot \hat{a}_{n-i}(\sigma_{n-M}), \quad (27)$$

$$q'_n(\sigma_{n-M+1}, [M+1, L]) = \underset{\{\sigma_{n-M}\} \mapsto \sigma_{n-M+1}}{sel} \left\{ q'_n \begin{pmatrix} \sigma_{n-M}, \\ [M+1, L] \end{pmatrix} \right\}, \quad (28)$$

$$q'_n(\sigma_{n-i}, [i+1, L]) = q'_n(\sigma_{n-i}, [i+2, L]) - f_{i+1} \cdot a_{n-i-1}, \quad (29)$$

$$q'_n(\sigma_{n-i+1}, [i+1, L]) = \underset{\{\sigma_{n-i}\} \mapsto \sigma_{n-i+1}}{sel} \{q'_n(\sigma_{n-i}, [i+1, L])\}. \quad (30)$$

$$q_n(\sigma_n) = q'_n(\sigma_n, [1, L]) = q'_n(\sigma_n, [2, L]) - f_i \cdot a_{n-1}. \quad (31)$$

According to one aspect of the invention, the pipelined DFU computes either partial ISI estimates as shown in FIG. 10 or partial ISI-free signal estimates as shown in FIG. 11. In FIG. 10, the received signal $r_n$ is accounted for near the output of the pipelined DFU, whereas in FIG. 11 the received signal $r_n$ is accounted for near the input of the pipelined DFU. For the invention, it does not matter where the received signal $r_n$ is accounted for inside the pipelined DFU.

Figure 12:
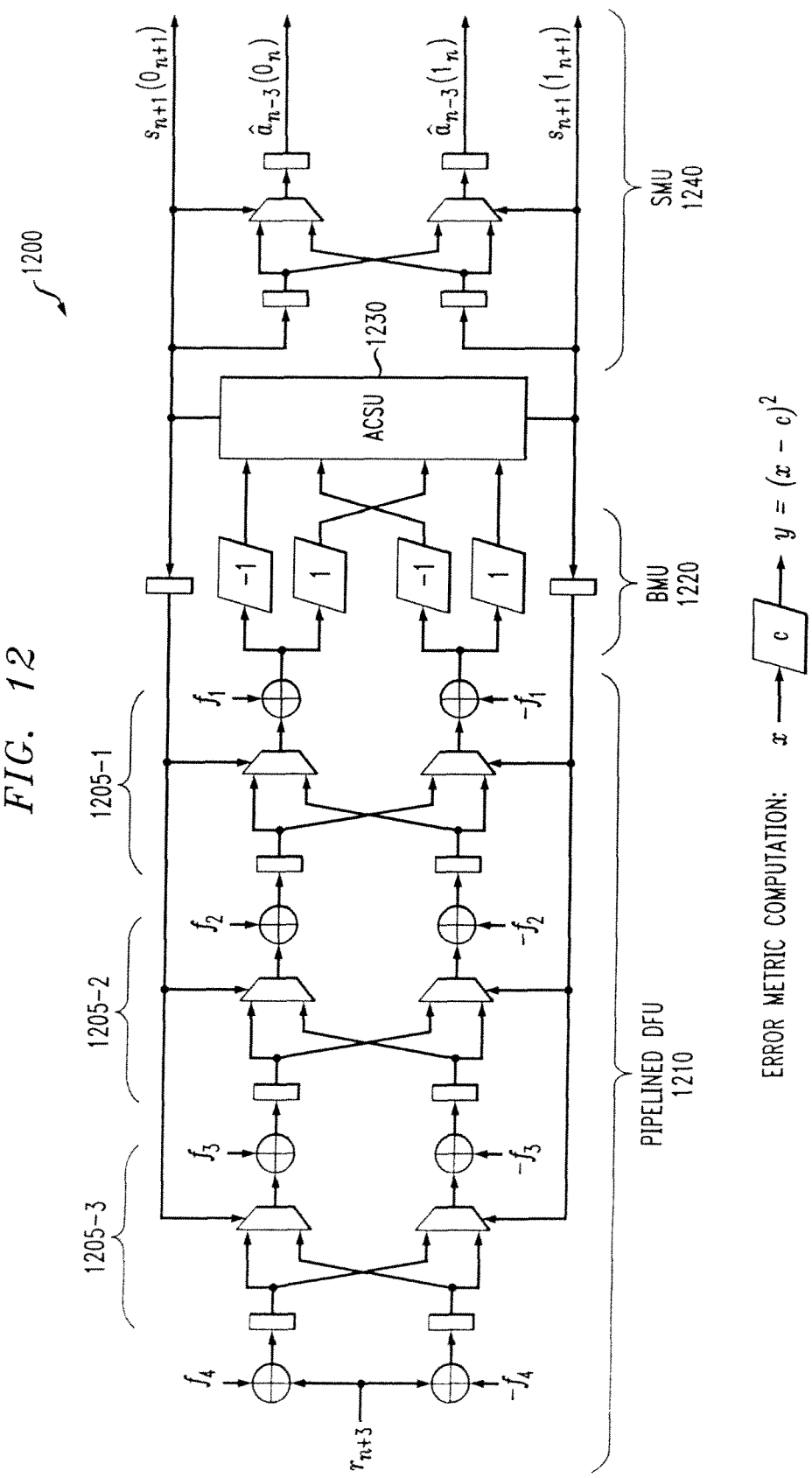
FIG. 12 is a schematic block diagram showing an alternate implementation of the reduced-state Viterbi Detector of FIG. 10.

FIG. 12 is a schematic block diagram showing an exemplary reduced-state Viterbi Detector 1200 that is an alternate implementation of FIG. 9, where L=4, K=1 and M=3. The reduced-state Viterbi Detector 1200 has three pipelining stages in the DFU 1210, in a similar manner to FIG. 10 and FIG. 11. As shown in FIG. 12, the pipelined decision-feedback unit 1110 changes the order of the multiplexers and pipeline registers in the functional units 1205 of the pipelined decision-feedback unit 1210 (relative to the implementation of FIG. 11). The pipelined DFU 1210 can be derived from the pipelined DFU 1110 using the cut-set transformation technique, which is described in the text book Peter Pirsch, Architectures for Digital Signal Processing (1998).

Figure 13:
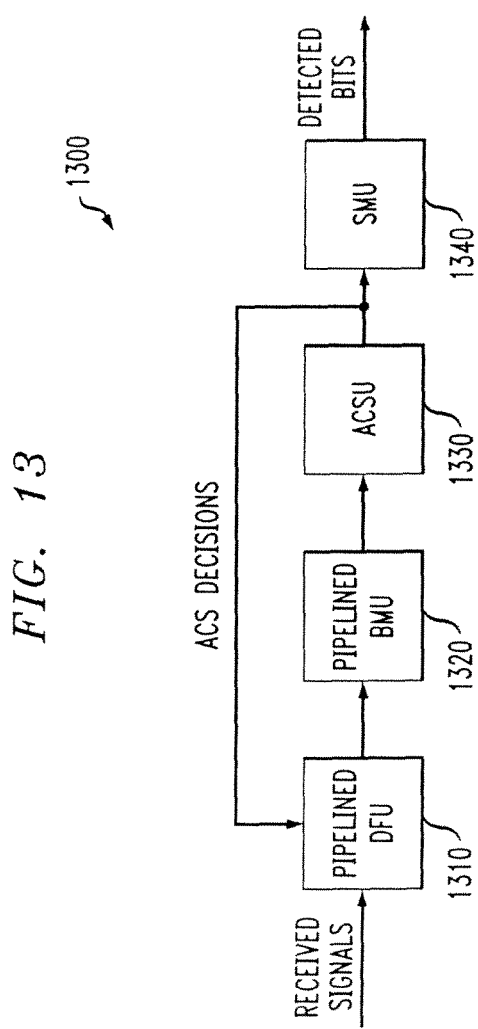
FIG. 13 is a schematic block diagram of a reduced-state Viterbi detector that incorporates a pipelined DFU and a pipelined branch metric unit (BMU)
Figure 14:
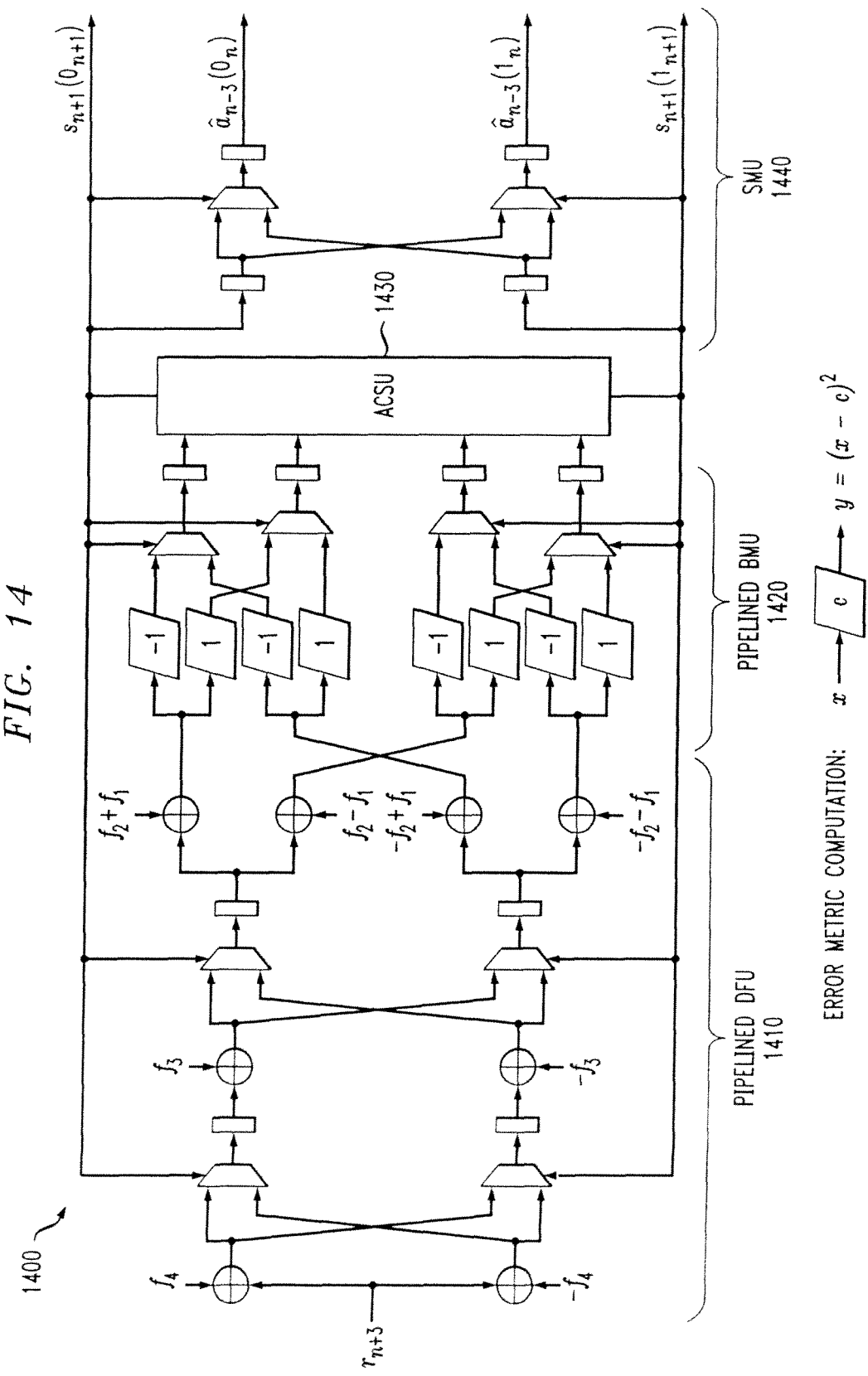
FIG. 14 is a schematic block diagram showing the implementation of the reduced-state Viterbi Detector of FIG. 13 with two pipelining stages in the DFU and one pipelining stage in the BMU.

Reduced-State Viterbi Detector Implementation with Pipelined DFU and Pipelined BMU The critical path of an reduced-state Viterbi detector implementation can be further reduced by precomputing branch metrics as shown in FIG. 13. The detailed implementation is shown in FIG. 14 for L=4, K=1 and M=3. Compared to FIG. 11, the addition of the ISI term associated with channel coefficient $f_1$ and the error metric computation have been moved before the final pipeline register and 2-to-1 multiplexer. Assuming that the metric computation has a delay equal to one addition, the critical path now includes an add-compare in the ACSU and a 2-to-1 multiplexer. It has the same length as in a Viterbi detector that implements MLSE. Therefore, This reduced-state Viterbi detector architecture will achieve the same throughput as a MLSE implementation without any decision-feedback, i.e., the maximum clock speed is completely independent from the number of survivor symbols (equal to L−K) used as decision-feedback to compute ISI estimates in the original RSSE algorithm. Twice as many branch metrics are computed in FIG. 14 compared to FIG. 11.

FIG. 13 is a schematic block diagram of a reduced-state Viterbi detector 1300 incorporating features of the present invention. As shown in FIG. 13, the reduced-state Viterbi detector 1300 includes a pipelined decision-feedback unit 1310, a pipelined branch metrics unit 1320, an add compare select unit 1330 and a survivor memory unit 1340. Again, the pipelined decision-feedback unit 1310 computes partial ISI-based estimates in a pipelined fashion. Partial ISI-based estimates are selected based on ACS decision. The pipelined branch metrics unit 1320 precomputes branch metrics for all transitions using the ISI-based estimates generated by the pipelined decision-feedback unit 1310. The add compare select unit 1330 determines the best survivor path into each state. The survivor memory unit 1340 stores the survivor paths.

FIG. 14 is a schematic block diagram showing an exemplary reduced-state Viterbi Detector 1400 that is an implementation of FIG. 13. The reduced-state Viterbi Detector 1400 has two pipelining stages in the DFU 1410, which computes partial ISI-free signal estimates. The pipelined branch metrics unit 1420 precomputes all possible, speculative branch metrics according to $$\tilde{\lambda}_n(\sigma_{n-1}, \tilde{a}_n) = (q'_n(\sigma_{n-1},[3,L]) - f_0 \cdot a_n - f_1 \cdot \tilde{a}_{n-1} - f_2 \cdot a_{n-2})^2,$$

where $\tilde{a}_{n-1}$ is a speculative channel symbol, and $a_{n-2}$ is defined by the state $\sigma_{n-1}$. As two values can be assumed for the speculative channel symbol $\tilde{a}_{n-1}$ due to the two-level modulation considered in this embodiment, and as there are two states with two transitions per state, 8 speculative branch metrics are precomputed. The correct branch metrics are selected based on ACS decision in a similar manner in which partial ISI-based estimates are selected.

Trace-Back Survivor Memory

Another benefit of the invention is that in the embodiments of FIG. 10, FIG. 11, FIG. 12 and FIG. 14 only ACS decisions are used to select ISI estimates or ISI-free signal estimates, while survivor symbols need not be fed back to pipelined DFU. When only ACS decisions are used in the pipelined DFU, the SMU 1040, 1140, 1240 and 1440 can be implemented using a trace-back structure, as survivor symbols are not used for local feedback unlike in a conventional DFU implementation shown in FIG. 6. The details of a trace-back survivor memory architecture are described in, e.g., R. Cypher and C. B. Shung, "Generalized Trace-Back Techniques for Survivor Memory Management in the Viterbi Algorithm," Journal of VLSI Signal Processing, 85-94 (1993); H.-L. Lou, "Implementing the Viterbi algorithm", IEEE Signal Processing Magazine, 42-52 (September 1995); or O. J. Joeressen and H. Meyr, "Viterbi Decoding with Dual Timescale Traceback Processing," IEEE International Symposium on Personal, Indoor and Mobile Radio Communications, 213-217 (September 1995), each incorporated by reference herein.

In a register-exchange survivor memory implementation, survivor symbols for each state are stored and updated at each detection step. In a trace-back implementation, however, ACS decisions are stored as pointers in a memory, and the detected symbols are obtained by tracing back the pointers that correspond to a survivor path. As the trace-back architecture does not require the updating of all survivor symbols at each detection step, it is associated with less power consumption than the register-exchange architecture. However, the trace-back architecture is associated with larger detection latency and therefore not suitable for the reduced-state Viterbi detector shown in FIG. 5, where zero delay survivor symbols are required for the local feedback to compute ISI estimates and branch metrics. However, the disclosed architectures shown in FIG. 10, FIG. 11, FIG. 12 and FIG. 14 use ACS decisions only to select and compute ISI estimates of ISI-free signal estimates, therefore making it possible to implement the survivor memory SMU using a trace-back architecture. In this case, the trace-back SMU will be associated with significantly less power consumption than a corresponding register-exchange SMU implementation.

1000BASE-T Gibabit Ethernet

1000BASE-T Gigabit Ethernet over unshielded twisted pair copper cabling is a challenging application in terms of the design of the sequence detector that accounts for the postcursor ISI and decodes the trellis code. The present invention allows for the implementation of the sequence detector as a reduced-state Viterbi detector with local feedback at the required data rate.

Figure 15:
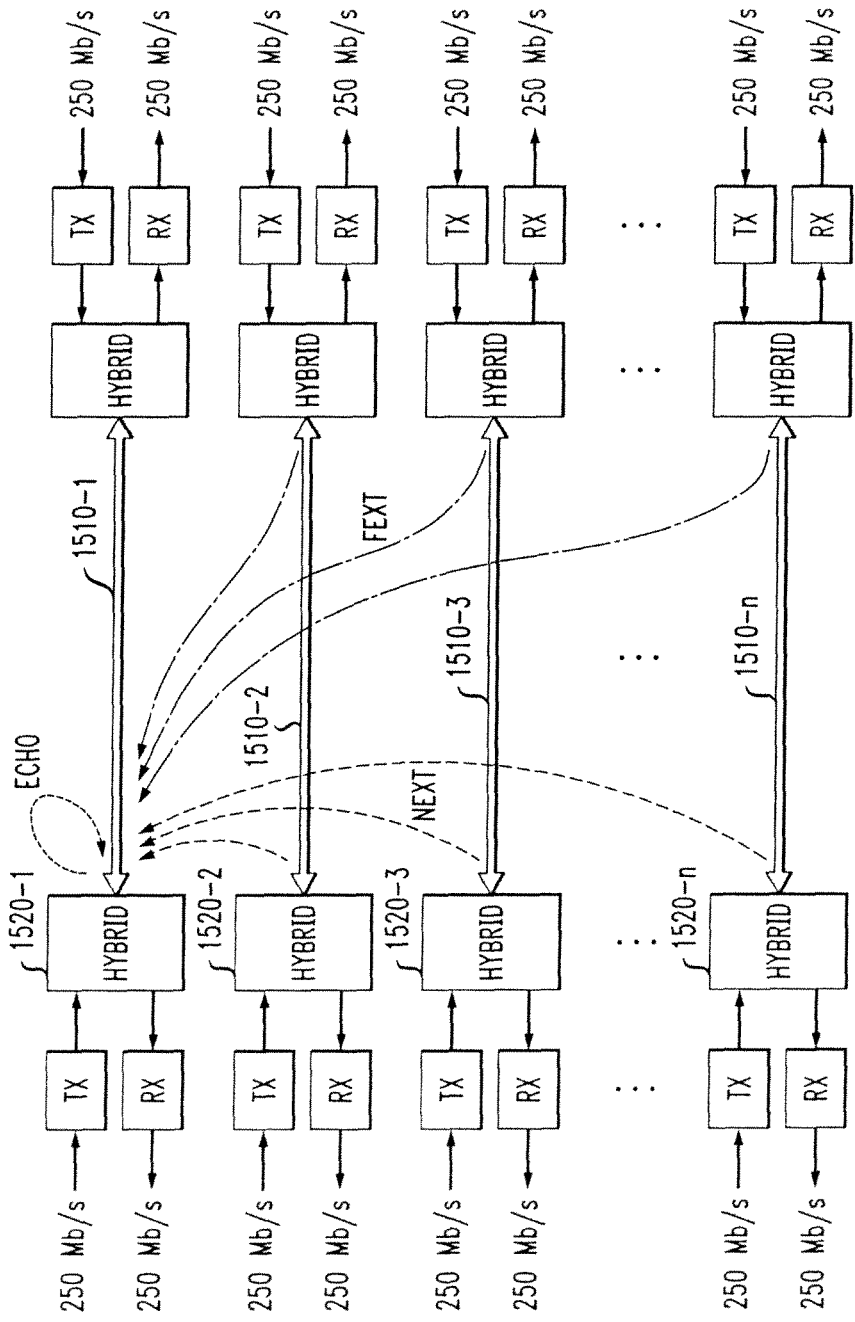
FIG. 15 illustrates the data transmission in 1000BASE-T Gigabit Ethernet over copper cabling.

The 1000BASE-T Gigabit Ethernet standard, as described, for example, in IEEE Standard 802.3ab, incorporated by reference herein, specifies full-duplex data transmission over four pairs of Category-5 copper cabling with a throughput of 1 Gb/s, as shown in FIG. 15.

Each wire pair 1510 transmits and receives data at a rate of 250 Mb/s at the same time. Hybrids 1520 separate the transmit and receive paths. PAM-5 modulation with the symbol values $\{-2,-1,0,1,2\}$ is employed. The received signal at the end of a wire pair is impaired by ISI, echo from the transmit signal of the same wire pair, near-end crosstalk (NEXT) from the local transmitters and far-end crosstalk (FEXT) from the remote transmitters of the three other wire pairs. On top of these impairments, there is also other noise.

Equalization, echo and NEXT cancellation are required to achieve a bit error rate of less than $10^{-10}$, which is prescribed by the 1000BASE-T standard. FEXT can be neglected in the 1000BASE-T application. 1000BASE-T employs multi-dimensional trellis-coded modulation to make the data transmission more reliable. The specified 4-D trellis code achieves an ISI-free asymptotic coding gain of approximately 6 dB.

Figure 16:
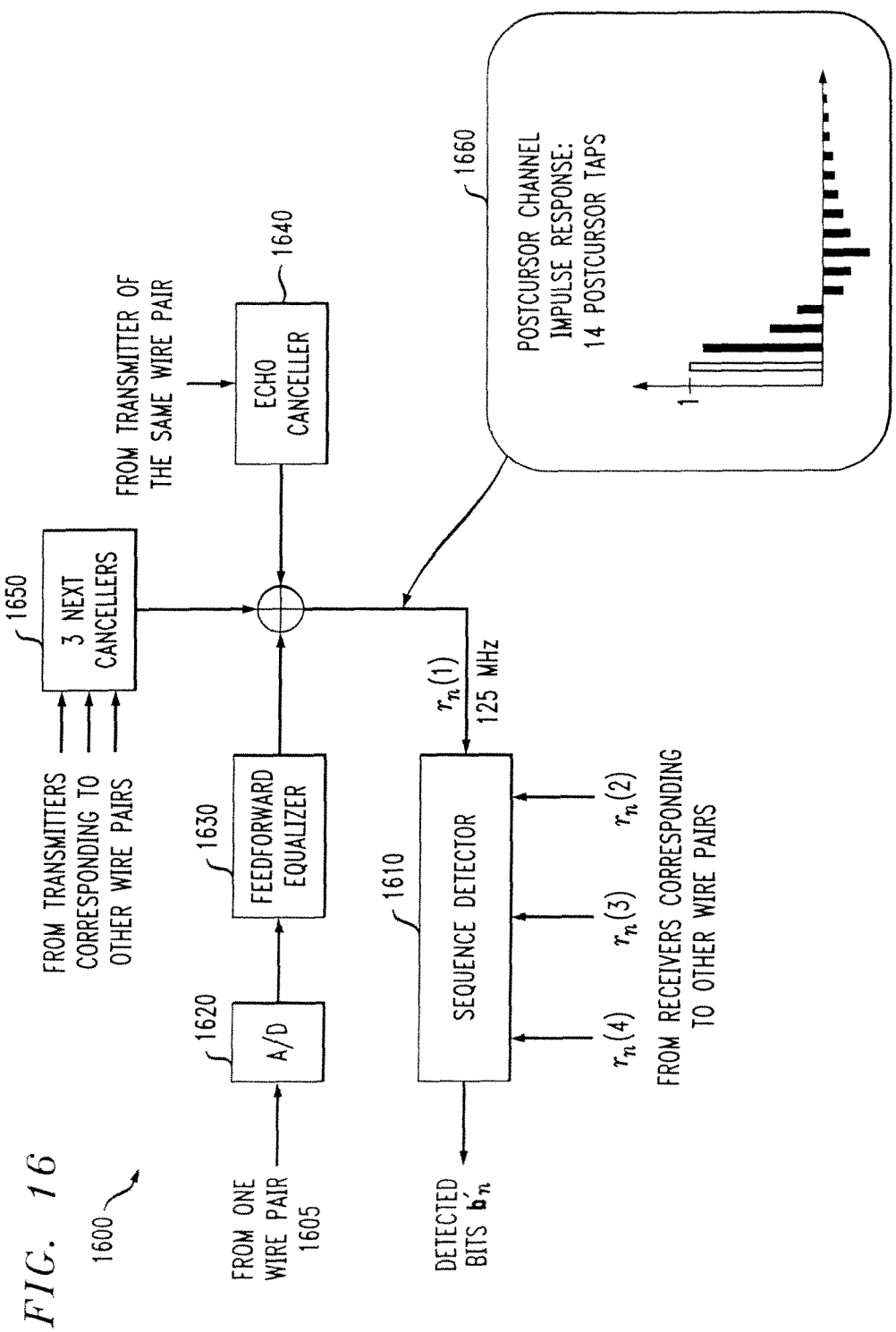
FIG. 16 is a schematic block diagram of a 1000BASE-T receiver implementation.

A cost-effective implementation of the 1000BASE-T Gigabit Ethernet standard demands that the whole transceiver including both the analog and digital signal processing are integrated in a single chip. A simplified receiver architecture 1600 without the analog front-end is shown in FIG. 16. Except for the sequence detector 1610, FIG. 16, shows only the processing blocks corresponding to one wire pair.

The output of a wire pair 1605 is first digitized using an A/D converter 1620 with 125 MHz or higher sampling rate. Adaptive feedforward equalization (FFE) 1630 removes precursor ISI to make the channel minimum-phase, and it whitens the noise. Echo from the transmitter corresponding to the same wire pair and NEXT from the transmitters corresponding to adjacent wire pairs are cancelled with respective adaptive cancellers 1640, 1650, respectively. After feedforward equalization 1630, echo cancellation 1640 and NEXT cancellation 1650, the channel impulse response 1660 comprises solely postcursors that span about 14 symbol periods. The sequence detector 1610 accounts for postcursor ISI and decodes the trellis code. The sequence detector 1610 inputs are the four received signals corresponding to the four wire pairs after feedforward equalization, echo and NEXT cancellation.

Figure 17:
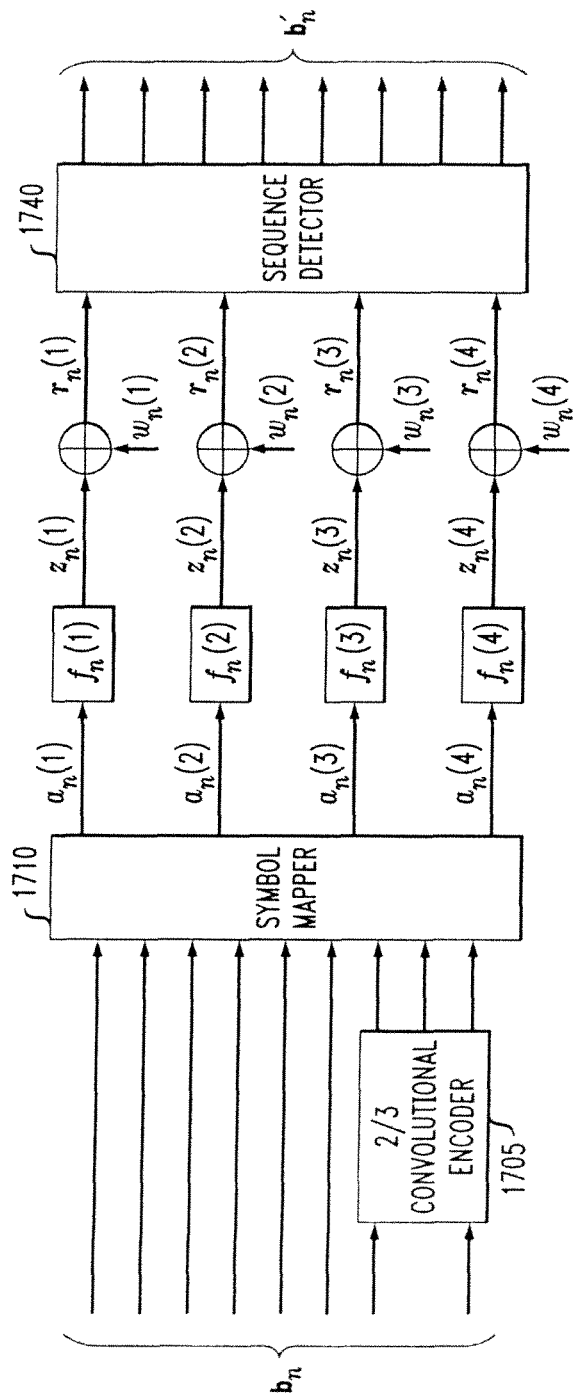
FIG. 17 is a schematic block diagram of the equivalent discrete-time channel model for 1000BASE-T Gigabit Ethernet.

After FFE, echo and next cancellation, the overall channel can be described using the equivalent discrete-time channel model 1700 shown in FIG. 17. Without loss of generality, it is assumed that the channel coefficients are known, the noise on a particular wire pair is white and Gaussian, and the noise sequences on the four wire pairs are uncorrelated.

In 1000BASE-T Gigabit Ethernet, the symbol period is 125 Mbaud, and each information symbol carries eight information bits, i.e., $b_n = (b_n(1), b_n(2), \ldots, b_n(8))$, where $b_n(i)$ is the i-th bit of the information symbol $b_n$. Two out of these eight information bits are encoded using a rate ⅔ convolutional encoder 1705 to produce one coded bit. The eight information bits and one coded bit are then mapped by a mapper 1710 into the 4-D symbol $a_n=(a_n(1), a_n(2), a_n(3), a_n(4))$, where the PAM-5 symbol $a_n(i)$ is transmitted over the i-th wire pair. The input into the sequence detector 1740 that corresponds to a particular wire pair is given by:

$$r_n = z_n + w_n = a_n + \sum_{i=1}^{L} f_i \cdot a_{n-i} + w_n, \quad (32)$$

where $\{f_i\}$ are the postcursor channel coefficients, $\{w_n\}$ the noise samples for this wire pair, and L is the postcursor channel memory. In (32), the wire pair number has been omitted, e.g., $r_n$ stands for $r_n(i)$, where i refers to one of the four wire pairs. Also hereinafter, the wire pair number will be omitted when the equation or variable refers to any of the four wire pairs.

Without loss of generality, the channel coefficient that corresponds to tap zero is equal to one, i.e., $f_0=1$. This is usually achieved by an automatic gain control (AGC) circuit in the receiver. Typically, the channel coefficients approach a value of zero after about 14 symbol periods. This indicates that it is sufficient to consider a postcursor channel memory of L=14.

Figure 18:
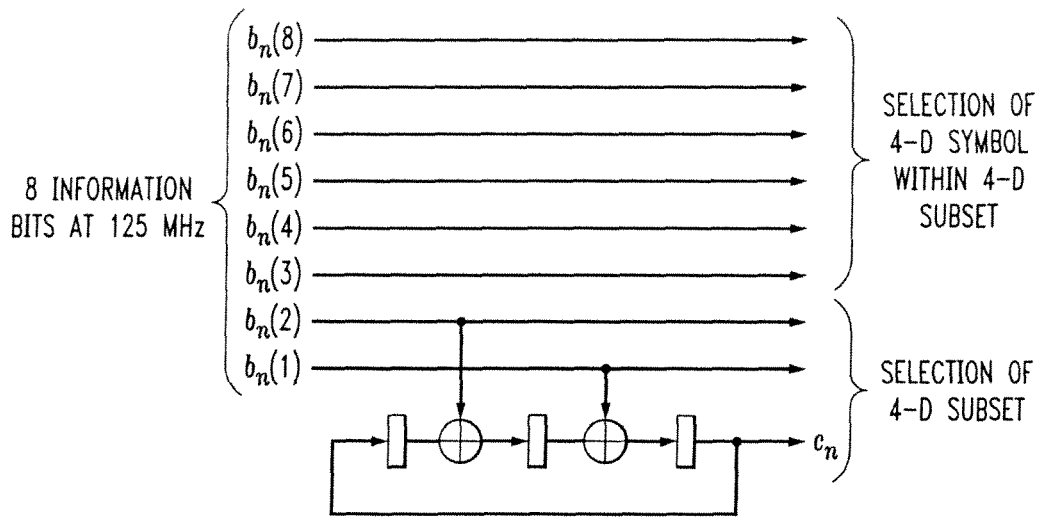
FIG. 18 is a schematic block diagram of the convolutional encoding in 1000BASE-T Gigabit Ethernet.

The information symbol $b_n$ with the eight information bits $(b_n(1), b_n(2), \ldots, b_n(8))$ is transmitted over the four wire pairs at a rate of 125 MHz. Out of these eight bits, the two information bits $b_n(1)$ and $b_n(2)$ are convolutionally encoded to produce a coded bit $c_n$ as shown in FIG. 18. FIG. 18 is a schematic block diagram of the convolutional encoding in 1000BASE-T Gigabit Ethernet. As two bits are encoded, and as three delay elements are used, this code can be described by the trellis shown in FIG. 19 with eight states and four branches per state.

After convolutional encoding, the nine bits are mapped into a 4-D symbol $a_n=(a_n(1), a_n(2), a_n(3), a_n(4))$. Following the subset partitioning principles developed by Ungerboeck, the 4-D symbol alphabet corresponding to $a_n$ is divided into eight different 4-D subsets S(0), S(1), . . . S(7) to maximize the Euclidean distance between allowed sequences in the trellis of FIG. 19. The two information bits $b_n(1)$ and $b_n(2)$ and the coded bit $c_n$ select one of the eight 4-D subsets, and the remaining information bits choose a particular 4-D symbol $a_n$ within the selected 4-D subset.

FIG. 20 illustrates the one-dimensional subset partitioning 2010 and four-dimensional subset partitioning 2020 in 1000BASE-T Gigabit Ethernet. In the 1-D signal space, which corresponds to a single wire pair, the PAM-5 symbol constellation is divided into the two 1-D subsets $A=\{-1,1\}$ and $B=\{-2,0,2\}$ leading to a minimum Euclidean distance of $\Delta^2=4$ between symbols of the same 1-D subset (see FIG. 20). By concatenating different combinations of four 1-D subsets, the eight 4-D subsets S(0), S(1), . . . S(7) are formed. Each 4-D subset consists of both A-type and B-type 4-D symbols. E.g., an A-type 4-D symbol of subset S(0) consists of A-type 1-D symbols for all four wire pairs. The 4-D subset partitioning guarantees a minimum Euclidean distance of $\Delta^2=4$ between different 4-D symbols in the same 4-D subset and $\Delta^2=2$ between 4-D symbols of different even 4-D subsets (S(0), S(2), S(4), S(6)) or odd 4-D subsets (S(1), S(3), S(5), S(7)).

Figure 19:
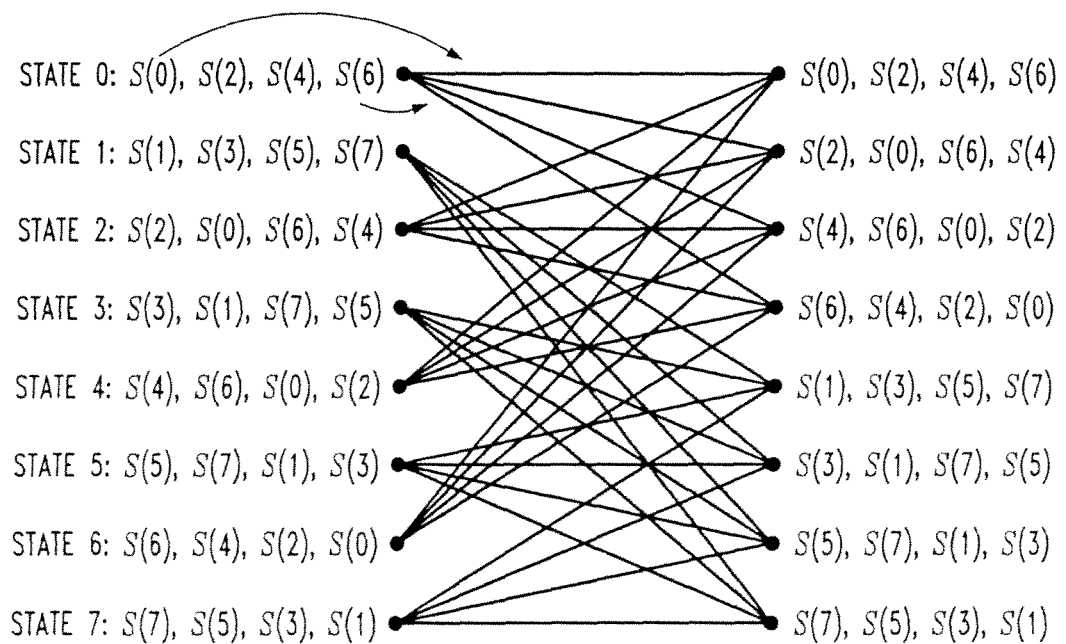
FIG. 19 illustrates the trellis diagram of the four-dimensional trellis code specified in 1000BASE-T Gigabit Ethernet.

Each transition in the trellis shown in FIG. 19 corresponds to a 4-D subset as specified in the table on the right hand side of FIG. 20. Only branches corresponding to even or odd 4-D subsets leave or enter each state. Therefore, the minimum Euclidean distance between allowed sequences is $\Delta^2=4$, which corresponds to an asymptotic coding gain of $10 \log_{10} 4=6$ dB over uncoded PAM-5 in an ISI-free channel.

Precomputing all possible branch metrics to shorten the critical path of an reduced-state Viterbi detector implementation of the sequence detector 1610 as described in U.S. patent application Ser. No. 10/853,089, entitled "Method and Apparatus for Precomputation and Pipelined Selection of Branch Metrics in a Reduced-State Viterbi Detector," becomes very complex for 1000BASE-T Gigabit Ethernet due to the multidimensional trellis code employed in this application. It is more feasible to compute partial ISI-based estimates in a pipelined fashion to shorten the critical path. FIG. 21 shows an architecture with two pipeline stages for 1000BASE-T Gigabit Ethernet. Partial ISI-based estimates are precomputed two time steps in advance using survivor symbols, and the correct ones are then selected based on ACS decisions. The selected partial ISI-based estimates are used to precompute 1-D error metrics one time step in advance. Correct 1-D error metrics are selected based on ACS decisions and survivor symbols. Branch metrics are calculated by combining the selected 1-D error metrics to form 2-D and 4-D error metrics. Compared to a conventional reduced-state Viterbi detector implementation as shown in FIG. 5, the critical path has been cut into three pieces, as the computation of partial ISI-based estimates, 1-D error metric calculation and ACS loop are separated from each other by a pipeline stage.

Reduced-State Viterbi Detector Architecture Incorporating a Pipelined DFU and Pipelined BMU for Multi-Dimensional Trellis Codes FIG. 21 shows the implementation of a reduced-state Viterbi detector 2100 for 1000BASE-T Gigabit Ethernet incorporating a pipelined DFU 2110 and a pipelined BMU 2120 according to the invention. This architecture illustrates how the invention can be applied to communications systems employing multi-dimensional trellis coding, such as 1000BASE-T Gigabit Ethernet. Without loss of generality, it is assumed now that the channel memory seen by the reduced-state Viterbi detector is L=14, the number of channel taps considered for the reduced-state definition is K=0, and the number of states in the reduced-state trellis is equal to the number of the trellis code states, i.e., eight. In the architecture of FIG. 21, partial ISI-based estimates are precomputed two time steps in advance, i.e., M=2.

Let $\sigma_n$ denote a state in the 8-state code trellis specified by the 1000BASE-T standard. A partial ISI estimate that accounts for channel coefficients $f_3, f_4, \ldots f_{14}$ and uses symbols from the survivor path into state $\sigma_n$ is given according to (22) as:

$$u'_{n+2}(\sigma_n, [3, 14]) = \sum_{1}^{12} f_{i+2} \cdot \hat{a}_{n-i}(\sigma_n). \quad (33)$$

This partial ISI estimate can be subtracted from the received signal to obtain a corresponding signal estimate that is partially free of ISI:

$$q'_{n+2}(\sigma_n,[3,14])=r_{n+2}-u'_{n+2}(\sigma_n,[3,14]). \quad (34)$$

Figure 22:
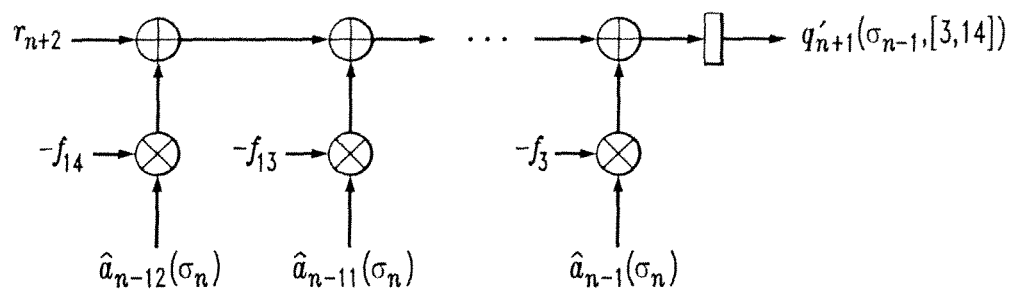
FIG. 22 is a schematic block diagram showing the computation of a partial ISI-free signal estimate using one pipelining stage.

The architecture 2200 for computing this partial ISI-free signal estimate is shown in FIG. 22.

A signal estimate for a transition from time n+1 to n+2 that accounts for survivor symbol information available at time n can be selected among precomputed estimates that correspond to predecessor states of $\sigma_n$:

$$q'_{n+1}(\sigma_n;[3,14]) = \underset{\{\sigma_{n-1}\}\to\sigma_n}{sel}\{q'_{n+1}(\sigma_{n-i};[3,14])\}, \quad (35)$$

where the selection is determined by the ACS decision for state $\sigma_n$, i.e., $s_n(\sigma_n)$. This selection circuitry 2300 is shown for state $0_n$ in FIG. 23.

A partial ISI-free signal estimate that accounts also for the ISI associated with channel coefficient $f_2$ can be computed according to (c.f. (29)):

$$q'_{n+1}(\sigma_n,[2,14])=q'_{n+1}(\sigma_n,[3,14])-f_2\cdot\hat{a}_{n-1}(\sigma_n), \quad (36)$$

where $\hat{a}_{n-1}(\sigma_n)$ is the most recent symbol from the survivor path into state $\sigma_n$. This signal estimate can be calculated one time step in advance. In this disclosed pipelined DFU implementation for 1000BASE-T Gigabit Ethernet, the ISI term associated with channel coefficient $f_2$ is not determined by the associated state, but can be computed using a respective survivor symbol.

Figure 23:
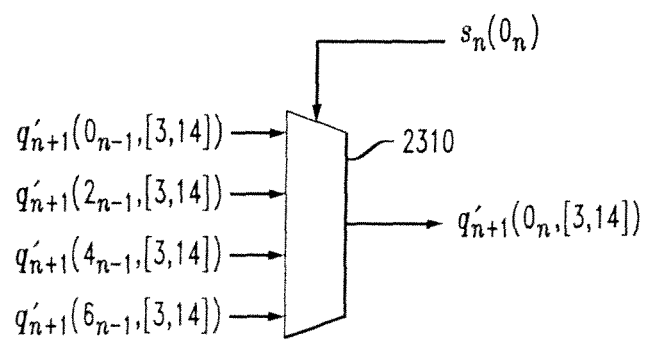
FIG. 23 is a schematic block diagram showing the selection of a partial ISI-free signal estimate that considers updated survivor information.
Figure 24:
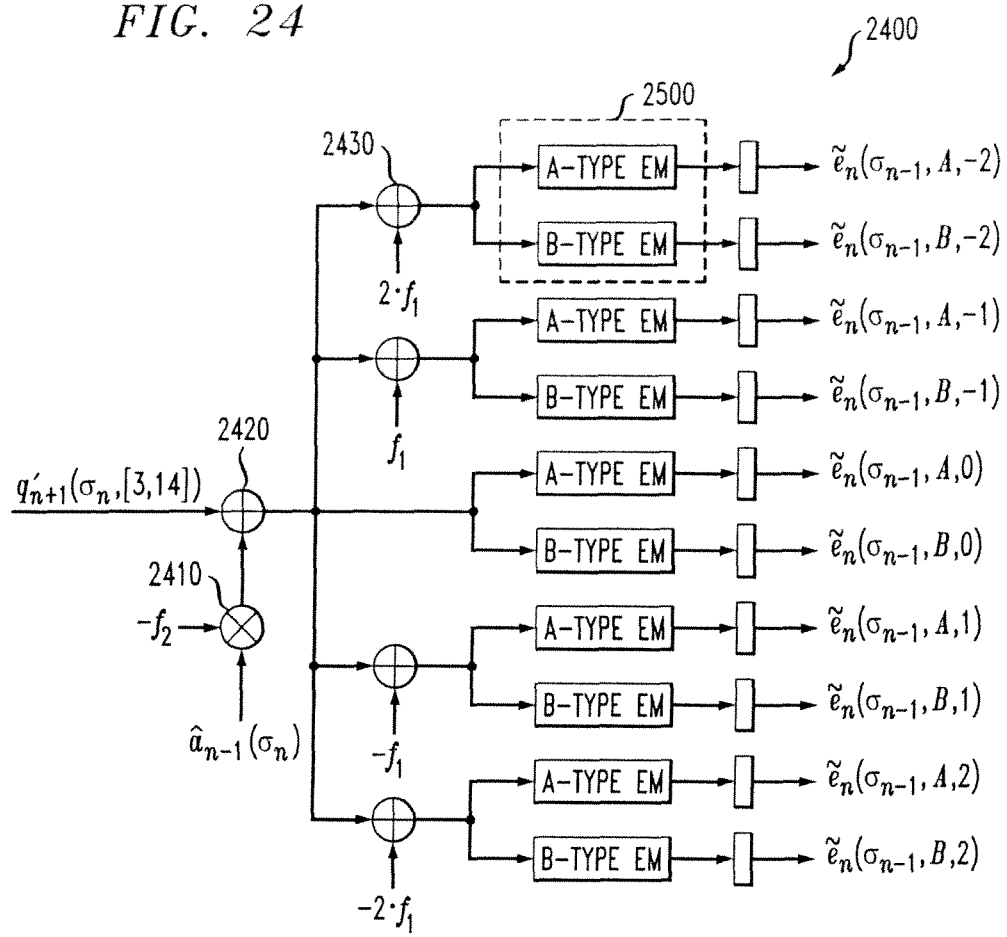
FIG. 24 is a schematic block diagram showing the computation of new partial ISI-free signal estimates and the precomputation of one-dimensional error metrics using one pipelining stage.
Figure 25:
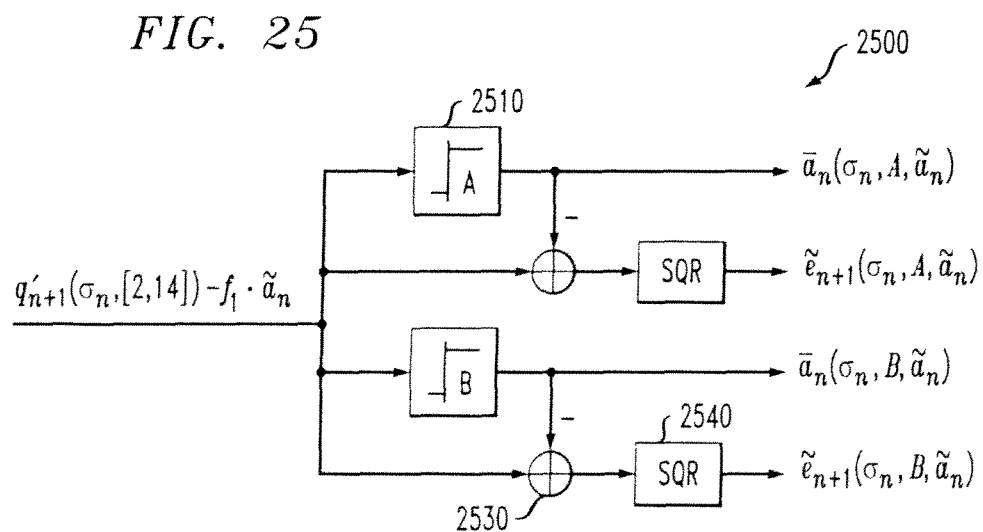
FIG. 25 is a schematic block diagram showing the computation of A-type and B-type 1-D error metrics in FIG. 24.

For each state and wire pair, A-type and B-type 1-D error metrics can be precomputed based on the corresponding speculative signal estimates according to $$\tilde{e}_{n+1}(\sigma_n,A,\tilde{a}_n)=(q'_{n+1}(\sigma_n,[2,14])-f_1\cdot\tilde{a}_n-\overline{a}_{n+1}(\sigma_n,A,\tilde{a}_n)) \quad (37)$$

$$\tilde{e}_{n+1}(\sigma_n,B,\tilde{a}_n)=(q'_{n+1}(\sigma_n,[2,14])-f_1\cdot\tilde{a}_n-\overline{a}_{n+1}(\sigma_n,B,\tilde{a}_n)) \quad (38)$$

where $\overline{a}_{n+1}(A)$ and $\overline{a}_{n+1}(B)$ are the best A-type and B-type 1-D symbols that are closest to the signal $(q'_{n+1}(\sigma_n,[2,14])-f_1\cdot\tilde{a}_n)$ in terms of Euclidean distance, and $\tilde{a}_n$ is a speculative data symbol for time n. The architecture 2400 for the precomputation of 1-D error metrics is shown in FIG. 24, where the 1-D error metric computation is implemented by circuitry 2500 as shown in FIG. 25. Either the symbol multiplication 2410 in FIG. 24 or the 4-to-1 multiplexer 2310 of FIG. 23 is in the critical path of the 1-D error metric precomputation. In addition, as shown in FIGS. 24 and 25, three additions 2420, 2430, 2530, slicing 2510 and squaring 2540 are performed within one clock period. As there are four wire pairs, eight states, five possibilities for $\tilde{a}_n$ (due to the PAM-5 signaling), and two possibilities for $\tilde{a}_{n+1}$ (A-type and B-type 1-D symbol), in total 8×4×5×2=320 1-D error metrics have to be precomputed.

Figure 26:
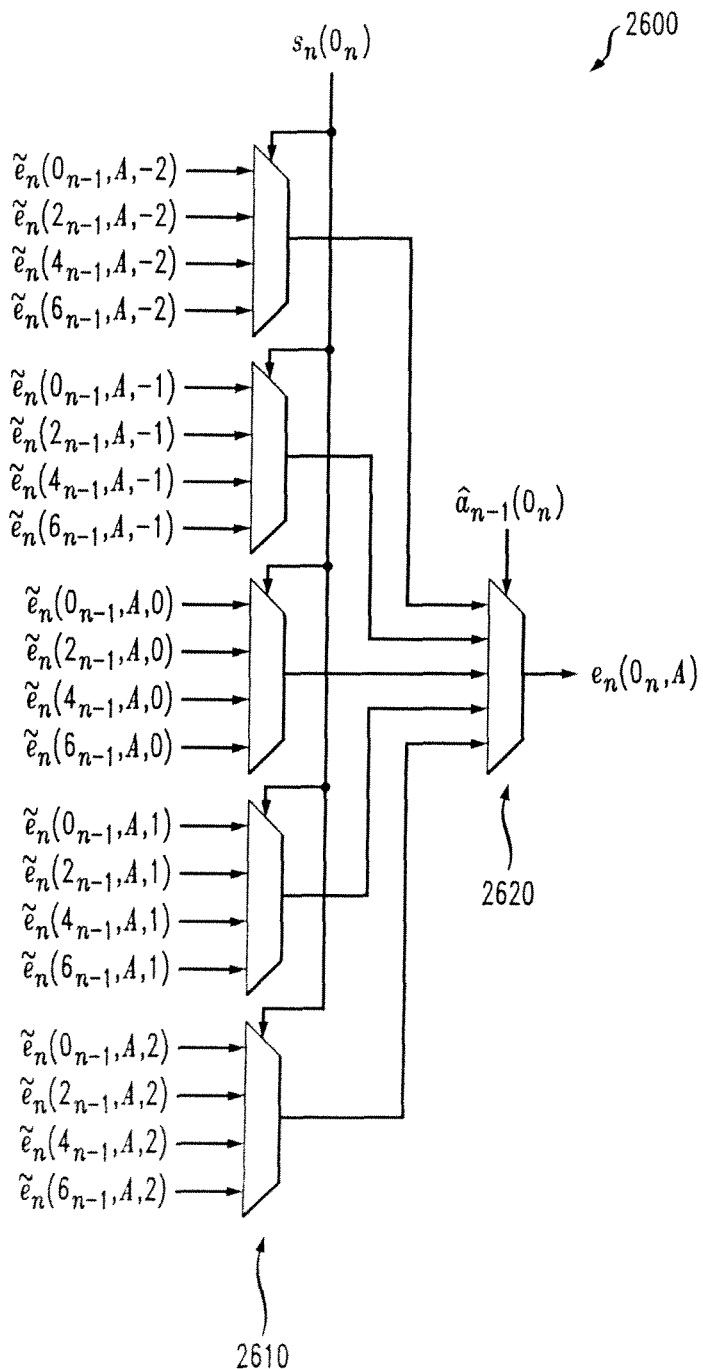
FIG. 26 is a schematic block diagram showing the selection of an one-dimensional error metric.

For each wire pair, state and 1-D subset type, there are 4×5=20 precomputed 1-D error metric candidates. Among these, the correct value that corresponds to a transition from $\sigma_n$ or to $\sigma_{n+1}$ is selected based on a corresponding ACS decision $s_n(\sigma_n)$ and survivor symbol $\hat{a}_{n-1}(\sigma_n)$. FIG. 26 is a schematic block diagram showing the selection circuitry 2600 of a one-dimensional error metric computed by the circuitry 2400. This selection is performed in two stages 2610, 2620 as shown in FIG. 26. First, the ACS decision $s_n(\sigma_n)$ determines the five speculative 1-D error metrics that correspond to the correct predecessor state $\sigma_{n-1}$. Then, the survivor symbol $\hat{a}_{n-1}(\sigma_n)$ selects the 1-D error metric that assumes that $\tilde{a}_{n-1}=\hat{a}_{n-1}(\sigma_n)$. FIG. 26 shows the selection of the 1-D error metric $e_n(0_n,A)$ among the corresponding 20 precomputed 1-D error metrics. The selection based on the ACS decision is done preferably before the selection based on the survivor symbol, as ACS decisions are available before the latest survivor symbols. The selection structure in FIG. 26 is required 64 times, as there are 64 1-D error metrics in 1000BASE-T Gigabit Ethernet that have to be provided for each trellis step.

Figure 27:
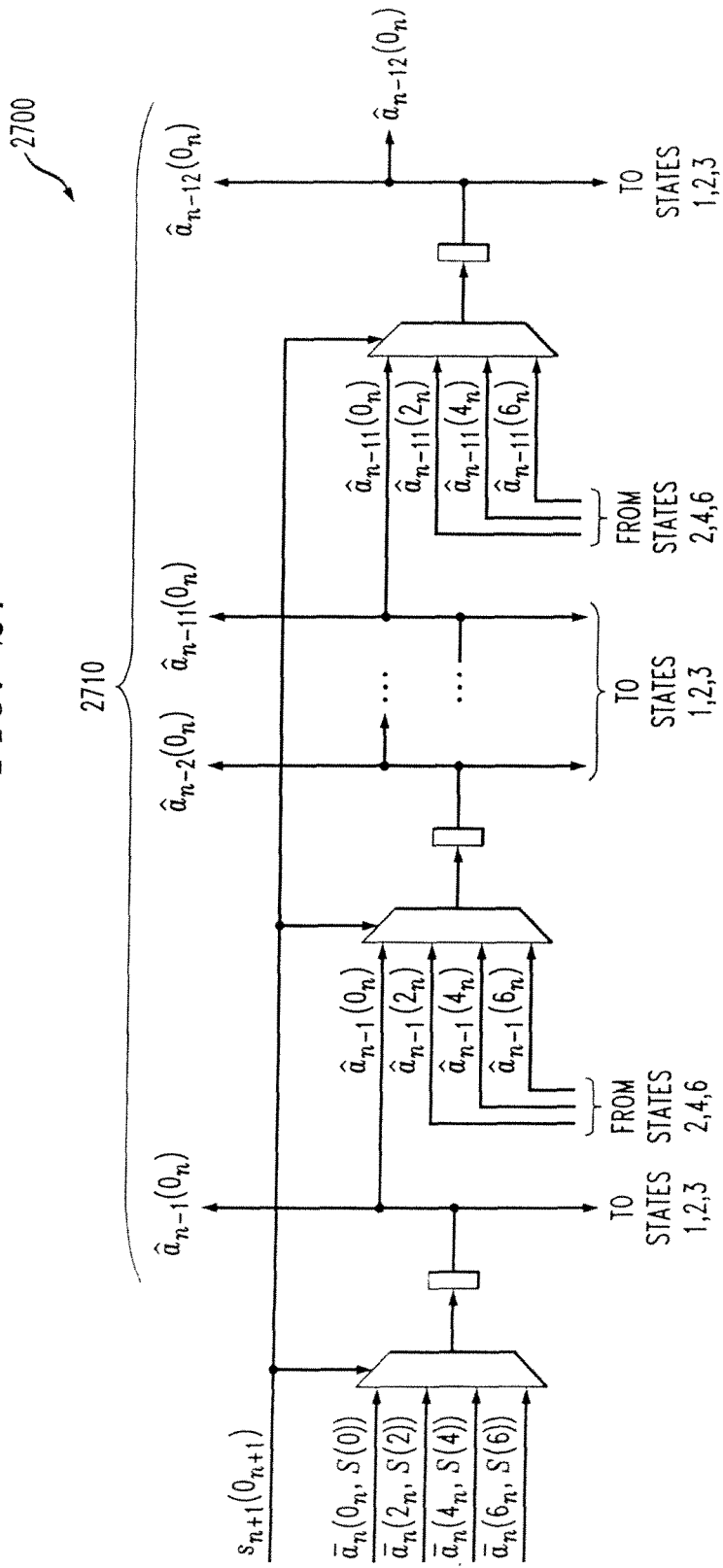
FIG. 27 is a schematic block diagram showing the row of the survivor memory unit that corresponds to one state of the trellis diagram shown in FIG. 19.

FIG. 27 is a schematic block diagram showing the row of the survivor memory unit 2700 that corresponds to one state of the trellis diagram. An exemplary survivor memory unit 2700 is implemented with a merge depth of 14 using the register-exchange architecture. The first twelve columns and first row are shown in FIG. 27. The survivor symbols 2710 corresponding to the time steps n−1, n−2, ... n−12 are used to compute partial ISI-free signal estimates as shown in FIG. 22. Survivor symbols corresponding to time step n−1 are also required for the computation of partial ISI-free signal estimates in FIG. 24 and for the selection of 1-D error metrics in FIG. 26.

It is to be understood that the embodiments and variations shown and described herein are merely illustrative of the principles of this invention and that various modifications may be implemented by those skilled in the art without departing from the scope and spirit of the invention.

We claim:

1. A register-exchange architecture to compute intersymbol interference-based estimates, comprising a plurality of functional units, wherein each functional unit comprises:
   a register that stores a partial intersymbol interference-based estimate, wherein said partial intersymbol interference-based estimate is either a partial intersymbol interference estimate or a partial intersymbol interference free signal estimate;
   a multiplexer that selects from among a plurality of partial intersymbol interference-based estimates computed at a prior stage using a decision from an associated state, wherein said partial intersymbol interference-based estimates comprise one or more of partial intersymbol interference estimates and partial intersymbol interference free signal estimates; and
   an arithmetic circuit that accounts for intersymbol interference associated with at least one channel tap.

2. The register-exchange architecture of claim 1, wherein said multiplexer has a plurality of inputs connected to other circuit elements based on a trellis structure.

3. The register-exchange architecture of claim 1, wherein a connection network between a plurality of said functional units is based on a trellis structure.

4. The register-exchange architecture of claim 1, wherein said multiplexer selects a partial intersymbol interference-based estimate from among previously computed partial intersymbol interference-based estimates for path extensions into a state.

5. The register-exchange architecture of claim 4, wherein said path extensions are determined based on a trellis.

6. The register-exchange architecture of claim 1, wherein said multiplexer is driven by an add-compare select decision.

7. The register-exchange architecture of claim 1, wherein said multiplexer uses only add-compare select decisions to select from among said partial intersymbol interference-based estimates.

8. The register-exchange architecture of claim 1, wherein said partial intersymbol interference-based estimates are computed using survivor symbols.

9. The register-exchange architecture of claim 1, wherein said register-exchange architecture comprises a pipelined decision feedback unit.

10. The register-exchange architecture of claim 1, wherein said register-exchange architecture is embodied in a reduced state detector.

11. The register-exchange architecture of claim 10, wherein said reduced state detector comprises one or more of a reduced state Viterbi detector with local feedback and a reduced state sequence estimator.

12. A method for computing intersymbol interference-based estimates using a register-exchange architecture, comprising:

storing a partial intersymbol interference-based estimate in at least one register, wherein said partial intersymbol interference-based estimate is either a partial intersymbol interference estimate or a partial intersymbol interference free signal estimate;

selecting from among a plurality of partial intersymbol interference-based estimates computed at a prior stage using a decision from an associated state, wherein said partial intersymbol interference-based estimates comprise one or more of partial intersymbol interference estimates and partial intersymbol interference free signal estimates; and accounting for intersymbol interference associated with at least one channel tap.

13. The method of claim 12, wherein said selecting step is performed using a multiplexer having a plurality of inputs connected to other circuit elements based on a trellis structure.

14. The method of claim 13, wherein said selecting step selects a partial intersymbol interference-based estimate from among previously computed partial intersymbol interference-based estimates for path extensions into a state.

15. The method of claim 14, wherein said path extensions are determined based on a trellis.

16. The method of claim 13, wherein said selecting step is driven by an add-compare select decision.

17. The method of claim 13, wherein said selecting step uses only add-compare select decisions to select from among said partial intersymbol interference-based estimates.

18. The method of claim 12, wherein said partial intersymbol interference-based estimates are computed using survivor symbols.

19. The method of claim 12, wherein said method is implemented using a pipelined decision feedback unit.

20. The method of claim 12, wherein said method is implemented using a reduced state detector.

21. The method of claim 20, wherein said reduced state detector comprises one or more of a reduced state Viterbi detector with local feedback and a reduced state sequence estimator.

* * * * *